(12) United States Patent
Deen et al.

(10) Patent No.: US 11,929,743 B2
(45) Date of Patent: Mar. 12, 2024

(54) HIGH-VOLTAGE SEMICONDUCTOR SWITCH

(71) Applicant: Quantinuum LLC, Broomfield, CO (US)

(72) Inventors: David A. Deen, Edina, MN (US); Paul M. Werking, Phoenix, AZ (US); Christopher Langer, Highlands Ranch, CO (US)

(73) Assignee: QUANTINUUM LLC, Broomfield, CO (US)

( * ) Notice: Subject to any disclaimer, the term of this patent is extended or adjusted under 35 U.S.C. 154(b) by 0 days.

(21) Appl. No.: 17/859,672

(22) Filed: Jul. 7, 2022

(65) Prior Publication Data

US 2023/0026029 A1 Jan. 26, 2023

Related U.S. Application Data

(60) Provisional application No. 63/225,801, filed on Jul. 26, 2021.

(51) Int. Cl.
*H03K 17/687* (2006.01)
*G06N 10/40* (2022.01)

(52) U.S. Cl.
CPC ......... *H03K 17/6871* (2013.01); *G06N 10/40* (2022.01)

(58) Field of Classification Search
CPC .................. H03K 17/6871; G06N 10/40
See application file for complete search history.

(56) References Cited

U.S. PATENT DOCUMENTS

| 10,147,724 B2 | 12/2018 | Madan et al. | |
|---|---|---|---|
| 2010/0277220 A1 | 11/2010 | Stoerk et al. | |
| 2012/0249216 A1 | 10/2012 | Ricotti et al. | |
| 2013/0049760 A1* | 2/2013 | Ono ..................... | H02J 7/0013 324/427 |
| 2015/0084157 A1* | 3/2015 | Tegen ............... | H01M 10/4257 257/528 |
| 2019/0392341 A1* | 12/2019 | Leipold ............... | H01L 29/0673 |
| 2020/0204171 A1 | 6/2020 | Stoerk | |
| 2021/0075184 A1 | 3/2021 | Bohn et al. | |
| 2022/0037313 A1 | 2/2022 | Deen et al. | |
| 2022/0101169 A1* | 3/2022 | Nam ..................... | G06N 10/20 |

OTHER PUBLICATIONS

English Translation of TW Office Action, including Search Report, dated Jun. 2, 2023 for TW Application No. 111127929, 6 page(s).
European search report and search opinion dated Dec. 21, 2022 for EP Application No. 22186711.

(Continued)

*Primary Examiner* — Metasebia T Retebo
(74) *Attorney, Agent, or Firm* — ALSTON & BIRD LLP

(57) ABSTRACT

A high-voltage semiconductor switch is provided. The high-voltage semiconductor switch comprises one or more switch subcircuits, wherein each switch subcircuit may comprise one or more FET circuits and voltage-shifting transistor. The high-voltage semiconductor switch may be configured based on operational and environmental requirements, such as those of a quantum computing system, wherein the high-voltage switch may be located in a cryostat or vacuum chamber.

20 Claims, 9 Drawing Sheets

(56) References Cited

OTHER PUBLICATIONS

Figure 1:
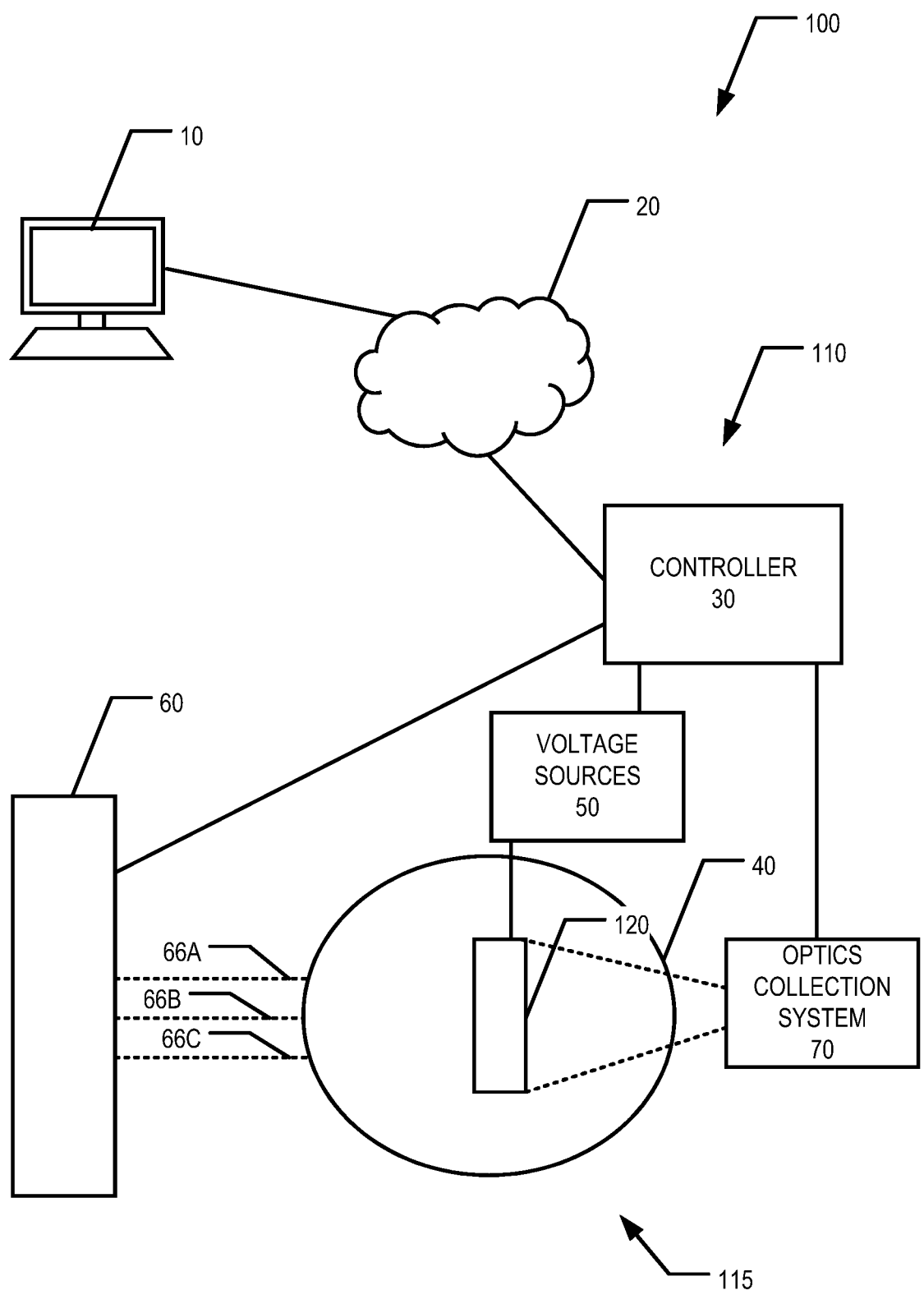

Guise, N. D., et al., "In-Vacuum Active Electronics for Microfabricated Ion Traps", AIP Rev. Sci. Inst., Jun. 3, 2014, 8 pages, vol. 85, No. 063101, retrieved from Cornell University ARXIV on the Internet at https://arxiv.org/pdf/1403.3662.pdf on Sep. 21, 2023.
Lamb, I. D. Conway, et al., "An FPGA-based instrumentation platform for use at deep cryogenic temperatures", AIP Review of Scientific Instruments, Jan. 4, 2016, pp. 014701-1 to 014701-7, vol. 87, retrieved from AIP Publishing on the Internet at https://pubs.aip.org/aip/rsi/article/87/1/014701/367382/ An-FPGA-based-instrumentation-platform-for-use-at on Sep. 21, 2023.
Stuart, J., et al., "Chip-integrated voltage sources for control of trapped ions," Oct. 17, 2018, Cornell University Archives, from the Internet at <arXiv: 1810.07152v1> , 7 pages.
Stuart, J., et al., "Chip-Integrated Voltage Sources for Control of Trapped Ions", Physical Review Applied, Feb. 5, 2019, pp. 024010-1 to 024010-7, vol. 11, American Physical Society, retrieved from MIT Libraries on the Internet at https://dspace.mit.edu/bitstream/handle/1721.1/120551/PhysRevApplied.11.024010.pdf?sequence=1&isAllowed=y on Sep. 21, 2023.
TW Office Action, including Search Report, dated Jun. 2, 2023 for TW Application No. 111127929, 9 page(s).
English Translation of TW Office Action dated Nov. 9, 2023 for TW Application No. 111127929, 4 page(s).
TW Office Action dated Nov. 9, 2023 for TW Application No. 111127929, 6 page(s).

\* cited by examiner

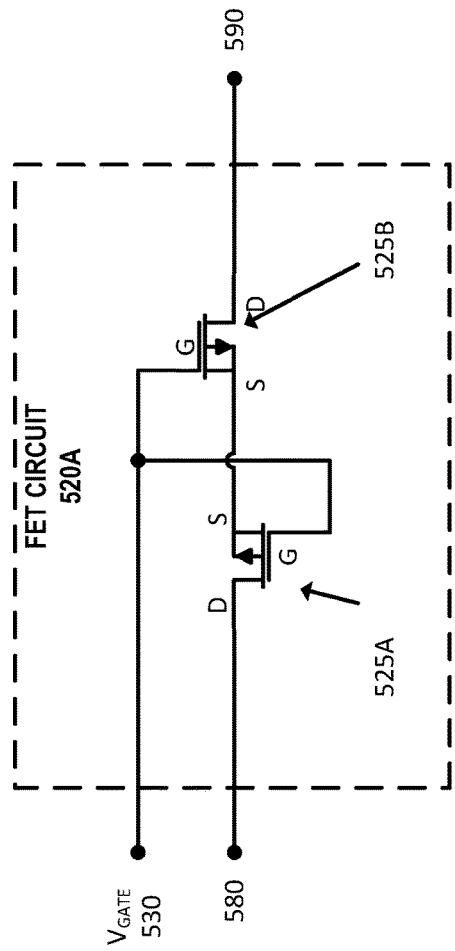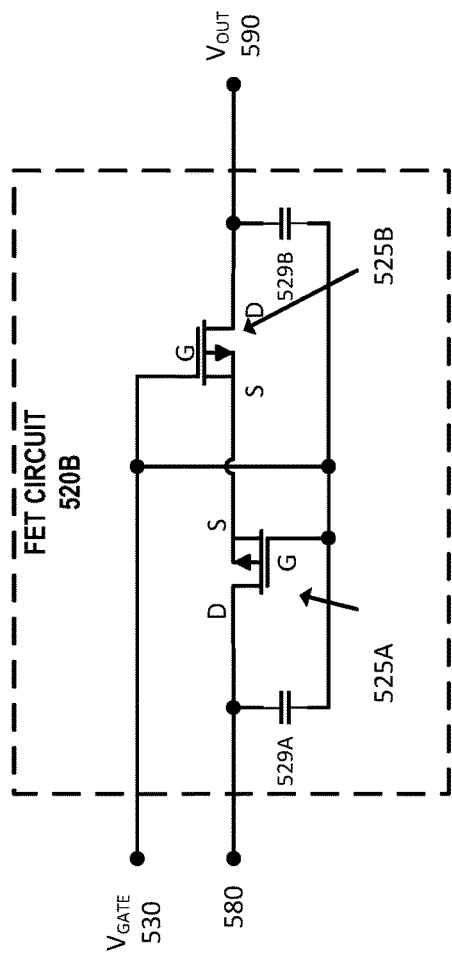

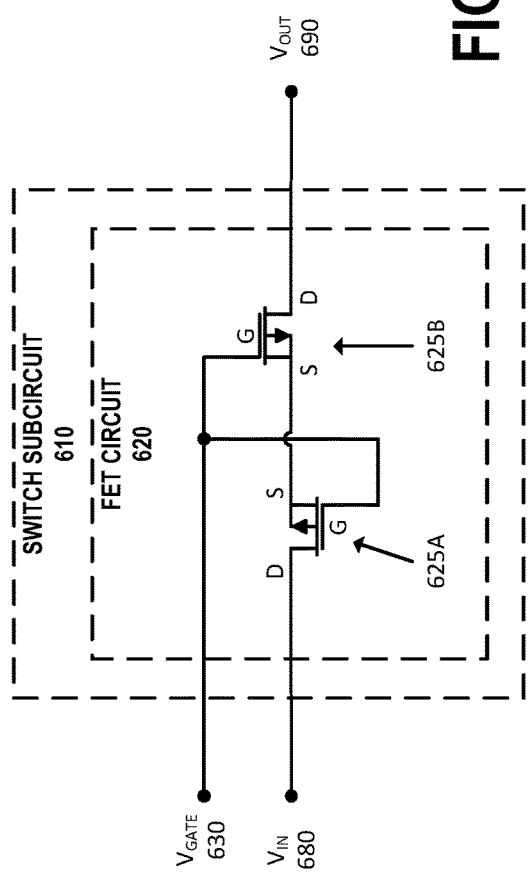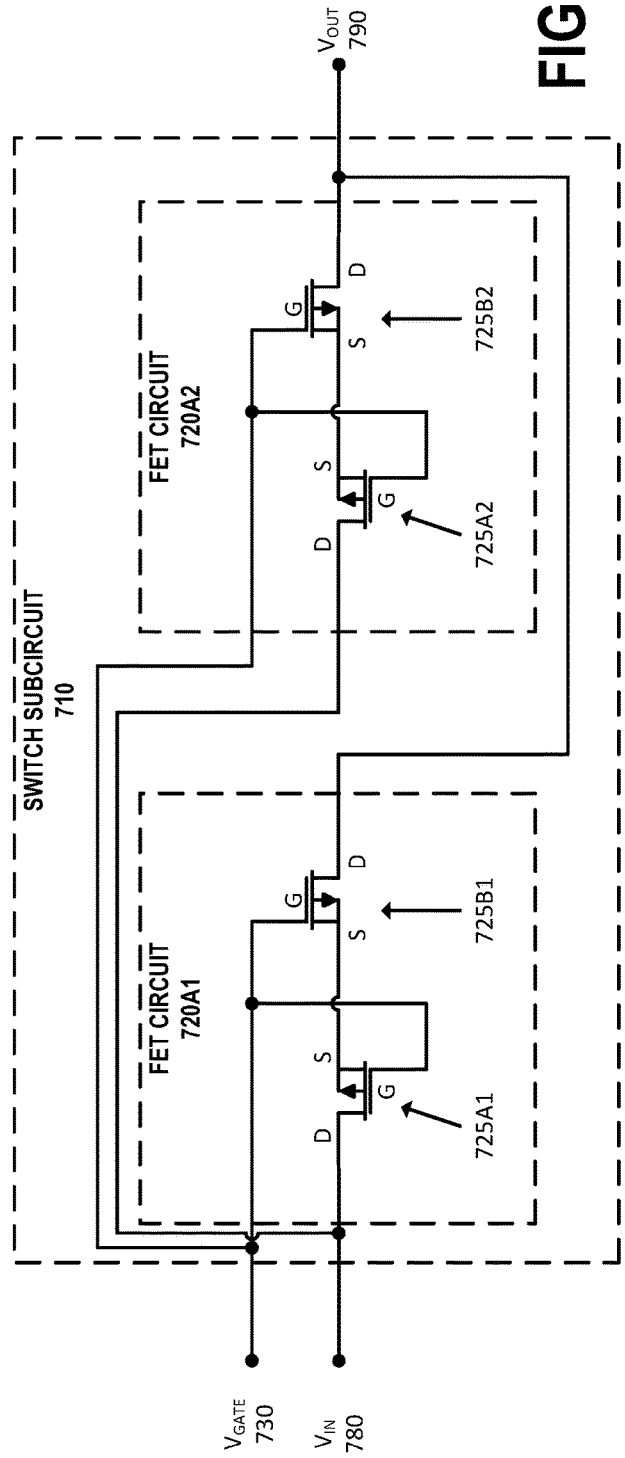

HIGH-VOLTAGE SEMICONDUCTOR SWITCH

CROSS-REFERENCE TO RELATED APPLICATIONS

The present application claims the benefit of U.S. Provisional Patent Application Ser. No. 63/225,801, which was filed on Jul. 26, 2021, the entire contents of which is incorporated by reference herein for all purposes.

TECHNICAL FIELD

Various embodiments relate to a high-voltage semiconductor switch. For example, some embodiments relate to a high-voltage semiconductor switch comprising one or more FET circuits with one or more voltage-shifting transistors, such as those used in electrical switching circuits of a quantum computer to control the flow of signals to an ion trap electrode.

BACKGROUND

Electrical switching circuits using transistors, such as field-effect transistors (FETs), have practical limitations which may limit the environment that such electrical switch circuits may be used in. Such limitations may be due to the composition of the electrical switching circuit the FET is used in or may be due to the manufacture of the FET. For example, electrical circuits for use in various specialty applications, such as for use in large-scale quantum computers, may use, among other things, higher voltages than traditional circuits. For example, traditional electrical switching circuits have used, for example, CMOS technology that has an intrinsic upper limit at 5 volts, which is not capable of meeting the operational criteria the operational criteria of, for example, quantum computers that may require high voltages. The operational criteria of electrical circuits may also have heightened requirements, such as requiring the semiconductor switches to meet specific operational criteria including but not limited to noise requirements or delay requirements. Through applied effort, ingenuity, and innovation, many deficiencies of prior semiconductor switches have been solved by developing solutions that are structured in accordance with the embodiments of the present invention, many examples of which are described in detail herein.

BRIEF SUMMARY OF EXAMPLE EMBODIMENTS

Example embodiments provide apparatuses, systems, methods, computer program products and/or the like for high-voltage semiconductor switches. For example, various embodiments provide apparatuses, systems, methods, computer program products, and/or the like for use in a quantum computer, including for use as a high-voltage semiconductor switch for ion trap electrode control in switching networks of the quantum computer. The high-voltage semiconductor switch may also be used in other applications that use a high-voltage semiconductor switches, as is discussed herein.

In an example embodiment, and according to an aspect of the present disclosure, a high-voltage semiconductor switch comprises a first switch subcircuit and a second switch subcircuit. In some instances, the first switch subcircuit comprises one or more FET circuits and a first voltage-shifting FET, wherein a first FET circuit of the first switch subcircuit comprises a first FET and a second FET; and the second switch subcircuit comprising one or more FET circuits and a second voltage-shifting transistor, wherein a first FET circuit of the second switch subcircuit comprises a third FET and a fourth FET. In some instances, each of the first FET, the second FET, the third FET, the fourth FET, the first voltage-shifting FET, and the second voltage-shifting transistor comprises a gate, a drain, and a source. In some instances, the gate of the first FET and the gate of the second FET are connected to a gate terminal of the first switch subcircuit; the gate of the third FET and the gate of the fourth FET are connected to a gate terminal of the second switch subcircuit; the source of the first FET, the source of the second FET, and the gate of the first voltage-shifting FET are connected; the source of the third FET, the source of the fourth FET, and the gate of the second voltage-shifting FET are connected. In some instances, an input terminal is connected to the drain of the first FET and the drain of the fourth FET, and an output terminal connected to the drain of the second FET and the drain of the third FET.

In an example embodiment, the output terminal of the high-voltage semiconductor switch is connected to an ion trap of a quantum computing system. In an example embodiment, the high-voltage semiconductor switch is located in a cryostat of the quantum computing system. In an example embodiment, the first FET and the second FET are p-channel FETs and the third FET and the fourth FET are n-channel FETs. In an example embodiment, the first FET, the second FET, the third FET, and the fourth FET are DMOS FETs. In an example embodiment, the first switch subcircuit further comprises a second FET circuit, wherein the first FET circuit of the first switch subcircuit and the second FET circuit of the first switch subcircuit are connected in parallel. In an example embodiment, a ratio of the one or more FET circuits of the first switch subcircuit to the one or more FET circuits of the second switch subcircuit is greater than one. In an example embodiment, a ratio of the one or more FET circuits of the first switch subcircuit to the one or more FET circuits of the second switch subcircuit is less than one. In an example embodiment, the high-voltage semiconductor switch is configured for no freeze-out at and below 20 Kelvin. In an example embodiment, the high-voltage semiconductor switch is monolithically integrated into a semiconductor material.

According to another aspect of the present disclosure, a method of driving a high-voltage switching circuit comprises providing the high-voltage semiconductor switch comprising a first switch subcircuit and a second switch subcircuit. In some instances, the first switch subcircuit comprising one or more FET circuits and a first voltage-shifting FET, wherein a first FET circuit of the first switch subcircuit comprises a first FET and a second FET; and the second switch subcircuit comprising one or more FET circuits and a second voltage-shifting transistor, wherein a first FET circuit of the second switch subcircuit comprises a third FET and a fourth FET. In some instances, each of the first FET, the second FET, the third FET, the fourth FET, the first voltage-shifting FET, and the second voltage-shifting transistor comprises a gate, a drain, and a source. In some instances, the gate of the first FET and the gate of the second FET are connected to a gate terminal of the first switch subcircuit; the gate of the third FET and the source of the fourth FET are connected to a gate terminal of the second switch subcircuit; the source of the first FET, the source of the second FET, and the gate of the first voltage-shifting FET are connected; the source of the third FET, the source of the fourth FET, and the gate of the second voltage-shifting FET are connected; an input terminal connected to the drain of the first FET and the drain of the fourth FET; and an output terminal connected to the drain of the second FET and the drain of the third FET. The method further comprises supplying a first voltage to the input terminal; switching the first switch subcircuit to conduct by applying an enable signal to a first and a second terminal of the high-voltage semiconductor switch, wherein the enable signal causes the first FET, the second FET, the third FET, and the fourth FET to conduct; and switching the first switch subcircuit to not conduct by a disable signal to first and second terminal of the high-voltage semiconductor switch, wherein the disable signal causes either the first FET, the second FET, or the first FET and second FET to not conduct and causes either the third FET, the fourth FET, or the third FET and the fourth FET to not conduct.

BRIEF DESCRIPTION OF THE SEVERAL VIEWS OF THE DRAWING(S)

Having thus described the invention in general terms, reference will now be made to the accompanying drawings, which are not necessarily drawn to scale, and wherein:

FIG. 1 is a schematic diagram illustrating an example quantum computing system comprising a quantum system controller according to an example embodiment.

Figure 2:
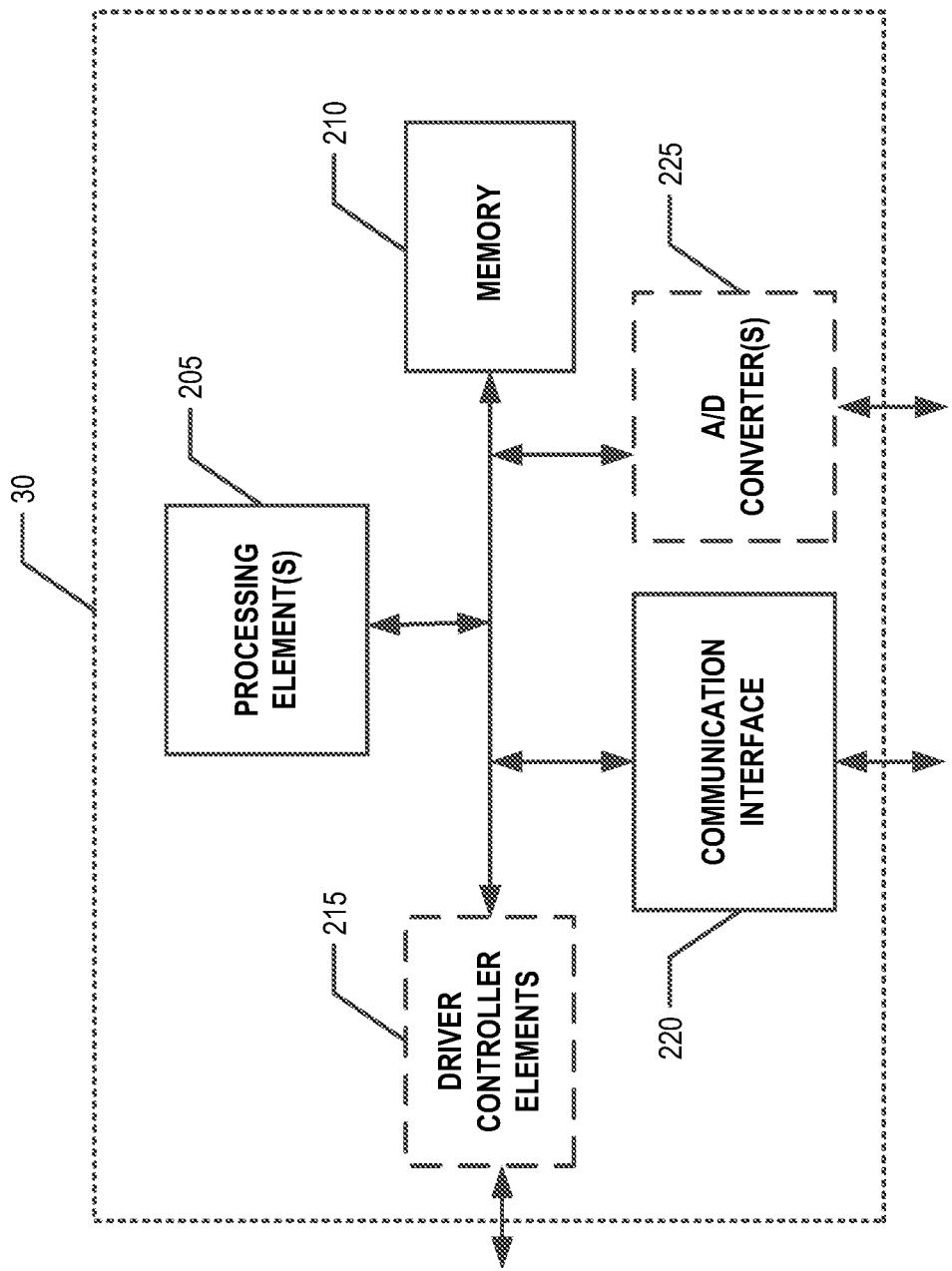

FIG. 2 provides a schematic diagram of an example quantum system controller of a quantum computer.

Figure 3:
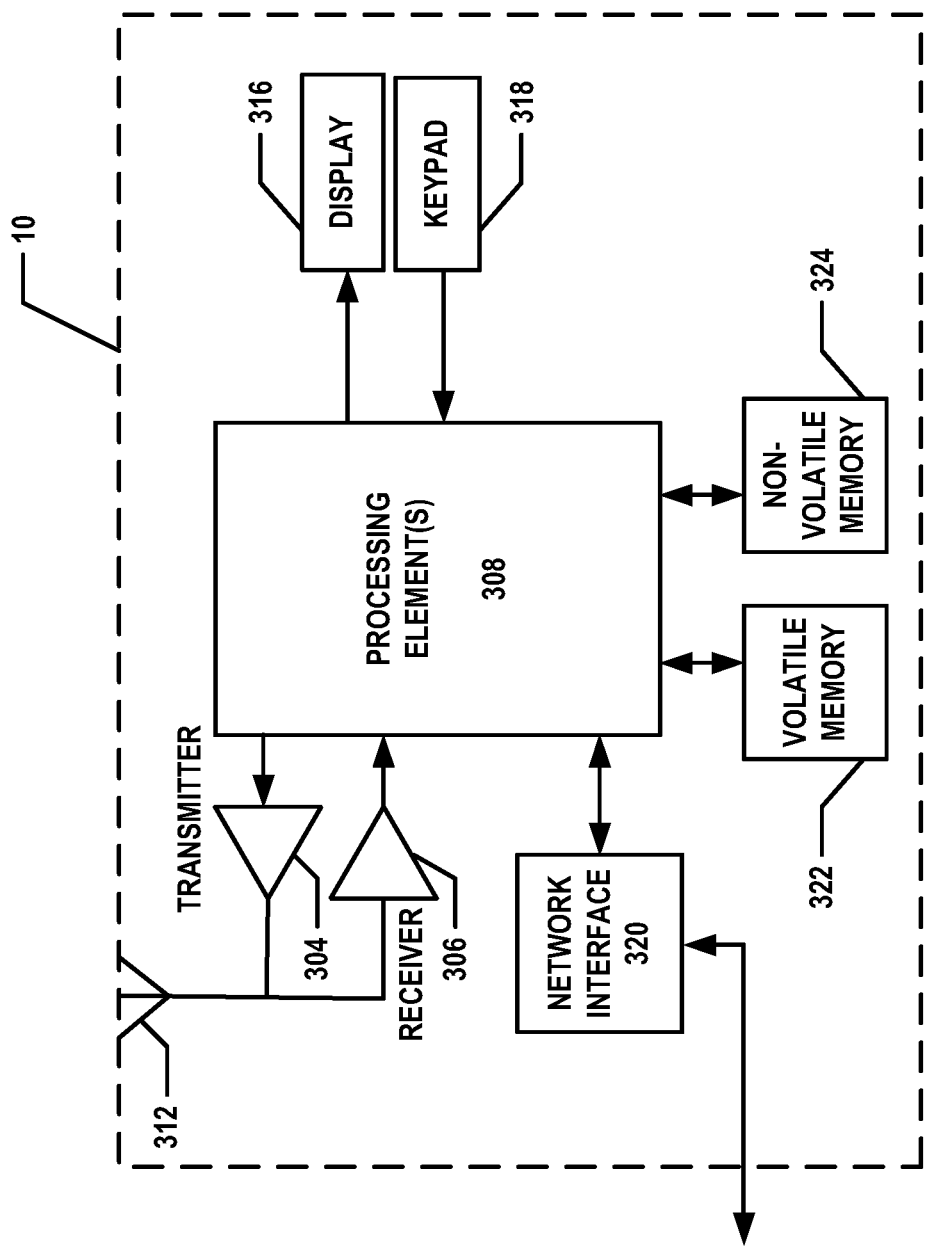

FIG. 3 provides a schematic diagram of an example computing entity of a quantum computer system that may be used in accordance with an example embodiment.

Figure 4:
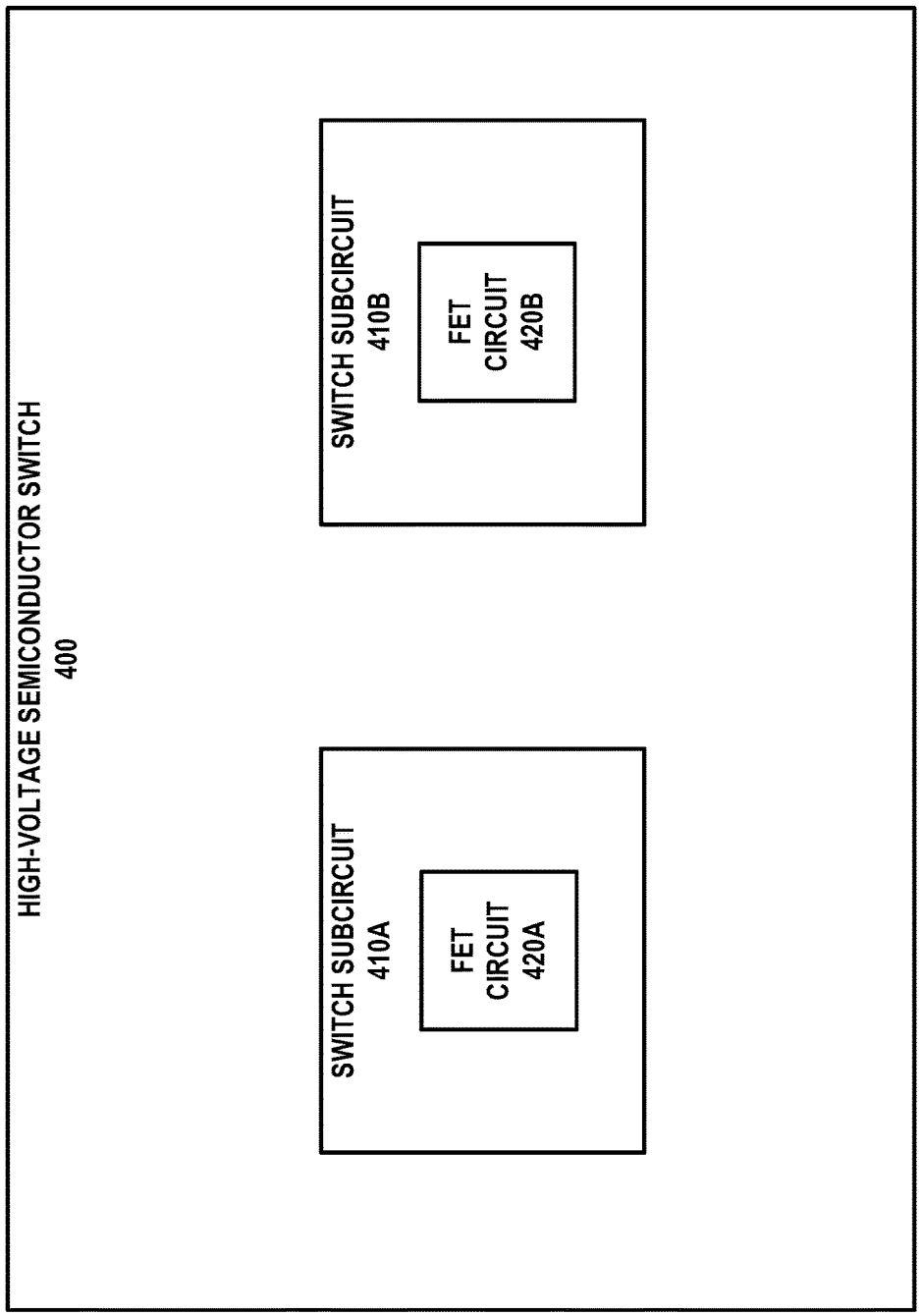

FIG. 4 provides a block diagram of a switch circuit that may be used in accordance with an example embodiment.

FIGS. 5A and 5B provide a schematic diagram of FET circuit that may be used in accordance with an example embodiment.

FIG. 6 provides a schematic diagram of a portion of a switch subcircuit that may be used in accordance with an example embodiment.

FIG. 7 provides a schematic diagram of a portion of a switch subcircuit that may be used in accordance with an example embodiment.

Figure 8:
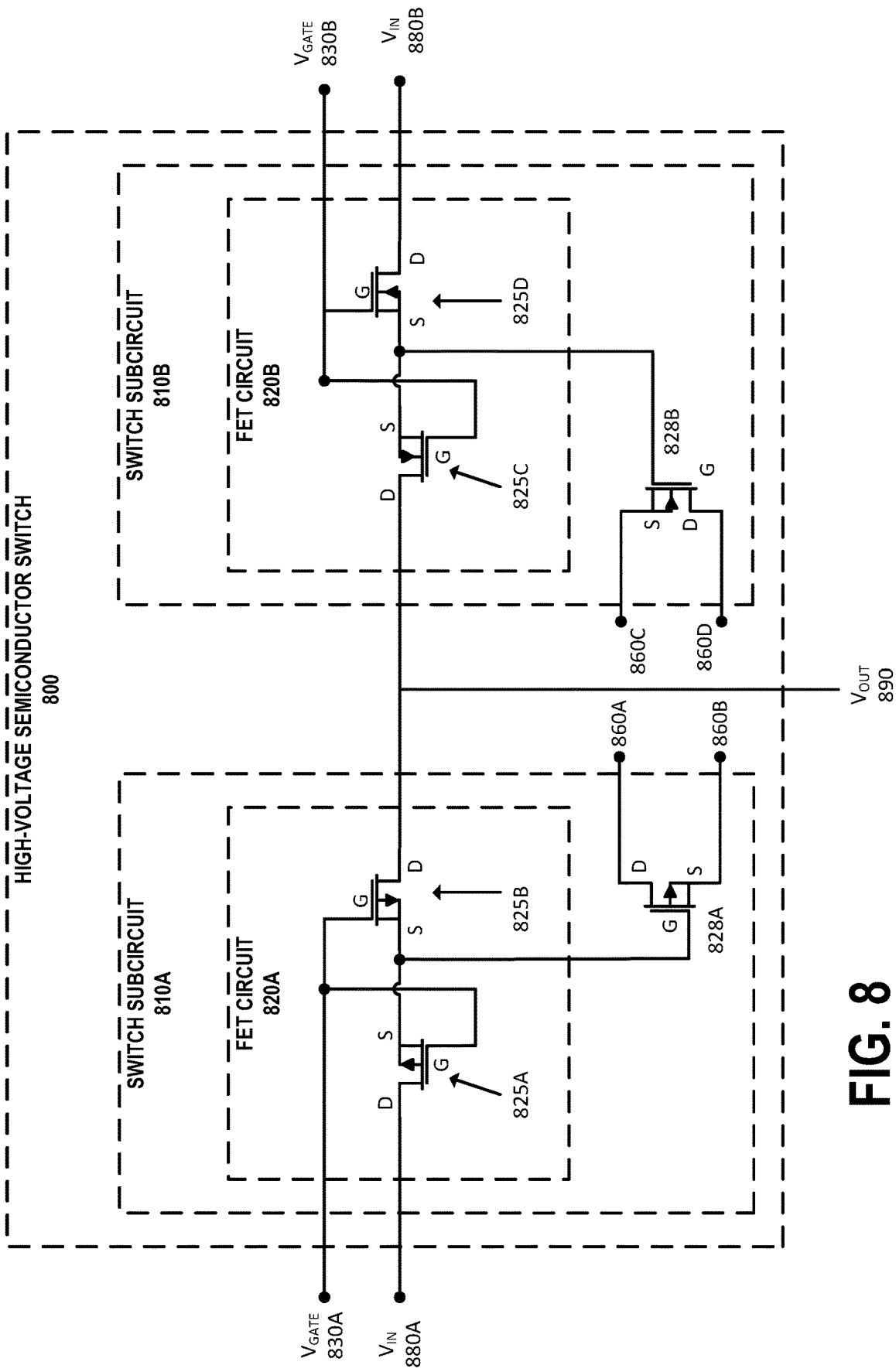

FIG. 8 provides a schematic diagram of a portion of a high-voltage semiconductor switch that may be used in accordance with an example embodiment.

Figure 9:
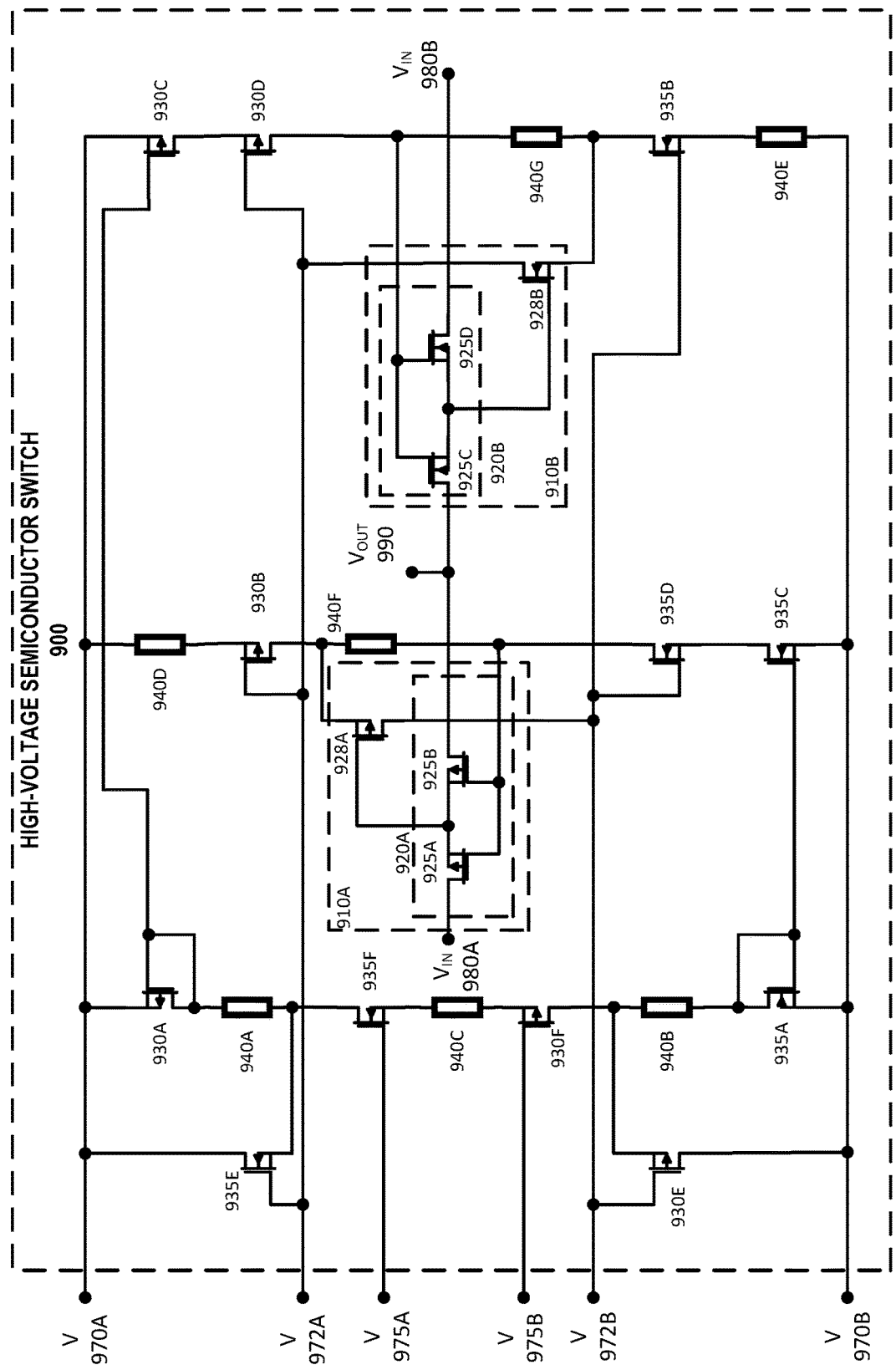

FIG. 9 provides a schematic diagram of a high-voltage semiconductor switch that may be used in accordance with an example embodiment.

Figure 10:
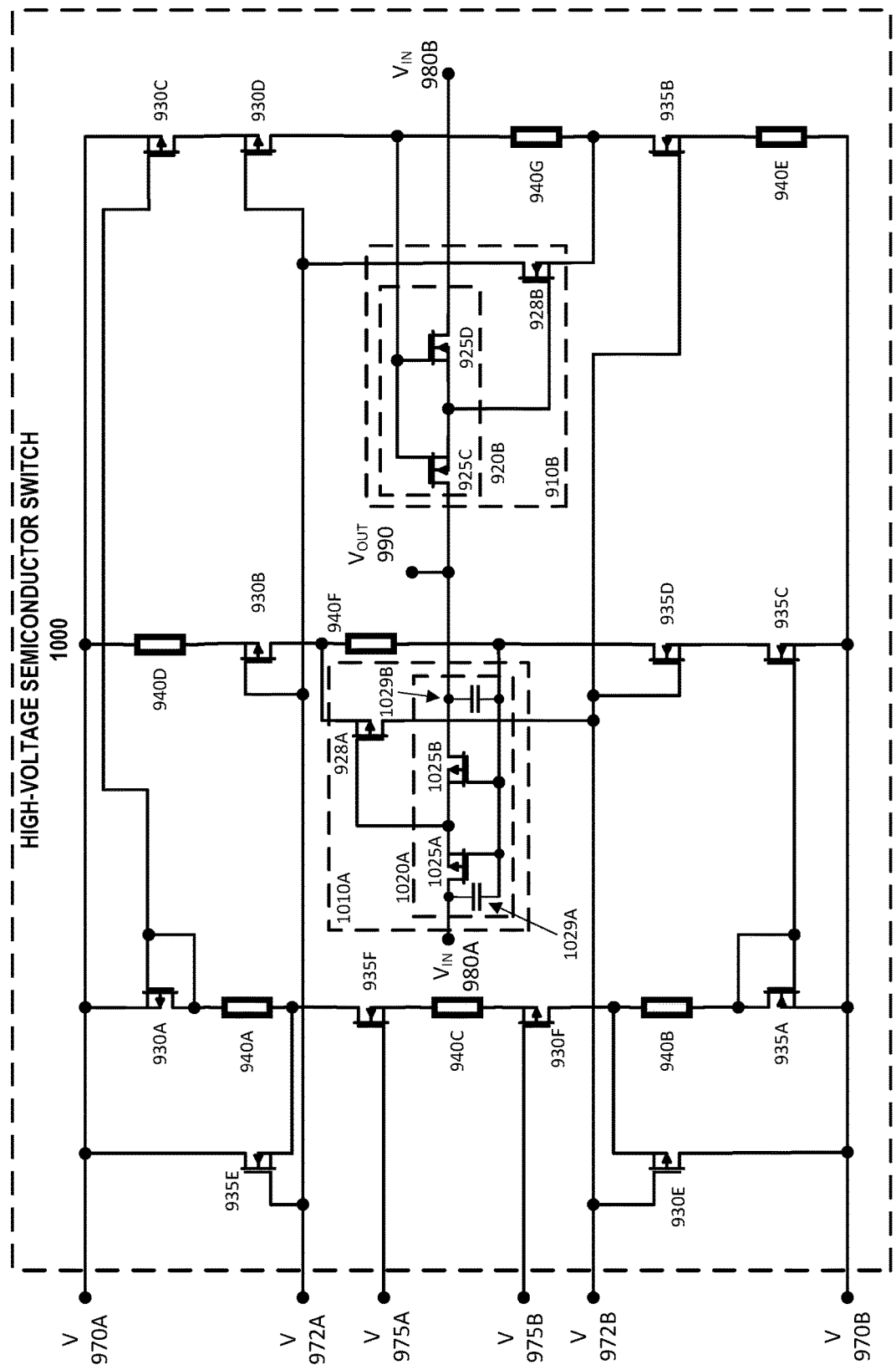

FIG. 10 provides a schematic diagram of a high-voltage semiconductor switch that may be used in accordance with an example embodiment.

DETAILED DESCRIPTION OF SOME EXAMPLE EMBODIMENTS

The present invention now will be described more fully hereinafter with reference to the accompanying drawings, in which some, but not all embodiments of the invention are shown. Indeed, the invention may be embodied in many different forms and should not be construed as limited to the embodiments set forth herein; rather, these embodiments are provided so that this disclosure will satisfy applicable legal requirements. The term "or" (also denoted "/") is used herein in both the alternative and conjunctive sense, unless otherwise indicated. The terms "illustrative" and "exemplary" are used to be examples with no indication of quality level. The terms "generally," "substantially," and "approximately" refer to within engineering and/or manufacturing tolerances and/or within user measurement capabilities, unless otherwise indicated. Like numbers refer to like elements throughout.

Example embodiments provide systems, apparatuses, methods, computer program products, and/or the like for a high-voltage semiconductor switch. For example, various embodiments provide systems, apparatuses, methods, computer program products, and/or the like for the design and use of a high-voltage semiconductor switch for use in a quantum computing system, including being in a cryostat of a quantum computing system. In various embodiments, the high-voltage semiconductor switch may be comprised of a plurality of switch subcircuits, each of which may be comprised of a plurality of FET circuits, each of which may be comprised of a pair of FETs connected as described herein.

Electrical circuits that control information flow via electrical signals may include one or more high-voltage semiconductor switches. In various embodiments, the high-voltage semiconductor switch is, as described further herein, configured to work with and/or operate at higher voltages than prior art switches. The increased voltage tolerance and/or operating range of the high-voltage semiconductor switch disclosed herein is due at least in part to the configuration of the electrical components comprising the switch, including but not limited to the use of a voltage shifting transistor. Prior art semiconductor switches have failed to operate when voltages are applied greater than +/−5 V while the high-voltage semiconductor switch described herein may operate at voltages exceeding the +/−5 V range when such a voltage is applied to the gate of a FET, while also providing additional benefits described here. In various embodiments, the high-voltage semiconductor switches may be used to switch on and off signals using voltages having magnitudes of 20 V (e.g., +/−20V), which may be used to drive loads requiring such voltages. In various embodiments, such electrical circuits include one or more high-voltage semiconductor switches that are used to control information flow to ion-traps of quantum computing systems. While not exclusive to quantum computing systems, the requirements and benefits of a high-voltage semiconductor switch allowing for the distribution of signals similar to a logic gate may be demonstrated with embodiments related to quantum computing system. As described in various embodiments herein, the high-voltage semiconductor switch may be comprised of transistors, such as field-effect transistors (FETs), and may be controlled by in a manner similar to a logic signal. Thus, as described further herein, the high-voltage semiconductor switches comprised of FETs may be used as a switch to control high-voltage signals. In various embodiments, the amount of load reactance the switch drives determines the size and/or transistor multiplicity of the pass-through transistors.

Electrical switching circuits using transistors, such FETs, have practical limitations which may include limits due to the environment such circuits are used in. For example, in embodiments used in quantum computing systems, electrical switching circuits may be located in the cryostat or vacuum chamber, with may require the circuits to operate at low temperatures. Such limitations may also be due to the composition of the electrical circuit the FET is used in or may be due to the manufacture of the FET. For example, electrical circuits of switching networks, such as those in large-scale quantum computers, may use higher voltages than traditional circuits, such as greater than +/−5V. The operational criteria of these electrical circuits may also have heightened requirements, including requiring the semiconductor switches in these electrical circuit to meet specific operational criteria, including but not limited to temperature requirements, noise requirements, and/or delay requirements. Thus a high-voltage semiconductor switch may be configured to address the environment the high-voltage semiconductor switch is to be located in.

In various embodiments, the high-voltage semiconductor switch may be incorporated into an ASIC. In various embodiments, the high-voltage semiconductor switch may be monolithically-integrated into a chip or into a semiconductor material, which may, among other things, save space and/or reduce losses, such as parasitic losses associated with connecting discrete components that are not monolithically integrated. In various embodiments, a high-voltage semiconductor switch may also serve as a building block by which many higher-order in-situ switching functions may be realized. In various embodiments, the high-voltage semiconductor switch may be a primitive operational circuit of a larger electrical circuit or integrated switching network.

In various embodiments, a high-voltage semiconductor switch may consist of two parallel field effect transistor (FETs) pairs: one p-channel (a.k.a. p-type) "FET" pair and one n-channel (a.k.a. n-type) "FET" pair to allow for the equal conduction of switch current in both directions. Each FET pair may be connected to a voltage-shifting transistor to ensure that the voltage across the gate-source junction of each of the transistors in the FET pair does not exceed a threshold. In various embodiments, the FETs used may be either p-channel or n-channel, and each FET may be either enhancement type or depletion type. As generally understood by one of ordinary skill in the art, p-channel FETs use hole flow as the primary charge carrier, n-channel FETs use electron flow as the primary charge carrier, enhancement type FETs are normally off devices (e.g., current does not flow through the FET when voltage applied to the gate is 0V), and depletion type FETs are normally on devices (e.g., current does flow through the FET when voltage applied to the gate is 0V).

In various embodiments MOSFETs (metal-oxide-semiconductor field-effect transistors) may be used, though other embodiments may use, for example, other types of transistors, such as DMOSFETs (double-diffused metal-oxide semiconductor field-effect transistor), junction FET (JFET), Metal-Insulator-Semiconductor FETs (MISFETs), Metal-Semiconductor (MESFETs), High Electron Mobility Transistors (HEMTs), and/or Heterojunction FET (HFET). In various embodiments, a DMOSFET may be used as DMOSFETs may operate over a greater temperature range than MOSFETs, including operating at lower temperatures without freeze-out. In various embodiments, each individual FET circuit may be composed of two DMOSFETs connected in series to withstand the high bipolar OFF-state voltages required by the embodiment.

In various embodiments, the electrical circuit implementing a high-voltage semiconductor switch may include the gate drive voltage being derived from a common source voltage by a unity gain source-follower amplifier. The electrical circuit implementing a high-voltage semiconductor switch may also include internal feedback for high-voltage compensation, such as with a voltage-shifting transistor. The gates of the transistors in the FET circuit are driven by a voltage translator so that enable/disable is achieved via a logic-level signal. In various embodiments, integrated active power distribution may be included in an application specific integrated circuit (ASIC) such that one or more terminals of the high-voltage semiconductor switch are provided one or more voltages.

In various embodiments, various complementary MOS fabrication techniques performable in a typical semiconductor fabrication facility or foundry with a silicon on insulator (SOI) process may be used to manufacture the FETs in the high-voltage semiconductor switch. In various embodiments, such processes include, but are not limited to, dopant implantations, drive-in anneals, photolithography for source-drain and gate electrode definitions, SiO2 oxidation, other oxide depositions, and poly-Si and silicide depositions.

In various embodiments, the high-voltage semiconductor switch serves as a single-pole single-throw semiconductor-based switch with the enable line serving as the throw control. In alternative embodiments, configurations may include single-pole double-throw (SPDT) switches, double-pole double-throw (DPDT) switches, and/or their derivatives. The DPDT configuration may be used for waveform distribution, and it may be achieved by ganging and/or coupling two SPST switch's enable lines in an inverted configuration such that when one SPST is on the other is off. In other embodiments, similar practice will lead to the additional variations of high-voltage semiconductor switch configurations.

In various embodiments, switch-related noise must also be mitigated. Switch noise in semiconductor-based switches arises due to several factors. Two switch-related noise sources that are important in the application of interest are charge injection from capacitive imbalance between the load and pass-through transistors and during specific on/off transitions of the switch when one switch is not entirely turned off when another switch turns on. The former has been referred to as "switch glitch" and occurs when excess charge, due to the imbalanced capacitance between load and transistor gate, is deposited on the load during an on/off transition. The result is an incrementally small excess voltage over the intended level present at the load. This excess voltage may be allowed to build through successive switch cycles as the capacitance imbalance continues to allow excess charge to be transferred. wherein at least one of the first switch subcircuit and the second switch subcircuit comprises at least one capacitor, wherein the capacitor mitigates charge injection to a load. The latter noise source is sometimes referred to as clock feedthrough. In various embodiments, noise mitigation may be accomplished by placing one or more capacitors across the gate-drain junction of the pass-through transistors as a means to match transistor capacitance to the load. In various embodiments, the capacitor(s) may serve to match capacitance and therefore to mitigate or eliminate the excess charge injection to the load in the system. In various embodiments using multiple high-voltage semiconductor switches, clock feedthrough may be mitigated by timing the switch transition in a multi-switch configuration such that no tandem switching event occurs in the timing sequence.

In embodiments related to quantum computers, the ion trap architectures of an example quantum computer may possess electrode quantities in excess of several thousand, which may include gridded regions for various ion transport operations. These ion trap architectures may use an interconnect paradigm requiring a wire bond and a physical feedthrough signal line allocated for every individual electrode. In such embodiments, in order to meet the requirement for this scale of electrodes, an integrated switching network serves to distribute the necessary waveforms for ion transport and to condense the interconnections that are integrated into the trap, and such an integrated switching network may use one or more of the high-voltage semiconductor switches. In various embodiments, the high-voltage semiconductor switch may be positioned inside the cryogenic environment of a quantum computing system in order to minimize signal feedthroughs, interconnects, and parasitic loses while managing an increased electrode count. In such embodiments, the high-voltage semiconductor switch may be a part of an integrated switching network, which may be used in quantum computers based on large-scale ion traps.

In various embodiments, the circuits of a high-voltage semiconductor switch may be compatible for operating in a high-vacuum and cryogenic (e.g., temperature range from over 300K down to below 4K) environment. Cryogenic operation imposes lower limits on doping density of the complementary FETs and diodes. In various embodiments, the cryogenic temperatures ranging from 77K down to below 4K cause the free carriers in Si to experience a reduction in energy due to the (cold) thermal bath. Such reduction in energy should not exceed the characteristic ionization energy of the dopant atom with respect to their nearest energy band (valence or conduction for acceptors and donors, respectively). Otherwise, charges may be retained by their parent dopant atoms and free carrier charge conduction will be quenched, which may be referred to as carrier freeze-out. In such embodiments, this requirement sets a lower limit to dopant density and/or dopant species for Si since the contrast between dopant species and Si energy band structure dictate ionization energy of the dopants.

In various embodiments, the high-voltage semiconductor switch may be used in a quantum computing system, such as the quantum computing system 100 depicted in FIG. 1. FIG. 1 provides a schematic diagram of an example quantum computing system 100 where the quantum processor comprises an atomic object confinement apparatus 120 (e.g., an ion trap and/or the like) having a plurality of atomic objects (e.g., atoms, ions, and/or the like) confined therein, in accordance with an example embodiment. In various embodiments, the quantum computing system 100 comprises a computing entity 10 and a quantum computer 110. In various embodiments, the quantum computer 110 comprises a quantum system controller 30 and a quantum processor 115. In various embodiments, the quantum system controller 30 is configured, programmed, and/or the like to control the quantum processor 115. In an example embodiment, the quantum processor 115 comprises a plurality of qubits (e.g., data qubits that may be organized into logical qubits, ancilla qubits, and/or the like). In various embodiments, the quantum computer 110 includes or communicates with databases (not shown) described herein. For example, the databases may be stored by one or more computing entities 10 that are in communication with the controller 30 via one or more wired and/or wireless networks 20 and/or stored by memory local to the controller 30.

In various embodiments, the quantum processor 115 comprises means for controlling the evolution of quantum states of the qubits. For example, in an example embodiment, the quantum processor 115 comprises a cryostat and/or vacuum chamber 40 enclosing a confinement apparatus 120 (e.g., an ion trap), one or more manipulation sources 60, one or more voltage sources 50, and/or one or more optics collection systems 70. For example, the cryostat and/or vacuum chamber 40 may be a temperature and/or pressure-controlled chamber. In an example embodiment, the manipulation signals generated by the manipulation sources 60 are provided to the interior of the cryostat and/or vacuum chamber 40 (where the atomic object confinement apparatus 120 is located) via corresponding optical paths 66 (e.g., 66A, 66B, 66C). In an example embodiment, the one or more manipulation sources 60 may comprise one or more lasers (e.g., optical lasers, microwave sources, and/or the like). In various embodiments, the one or more manipulation sources 60 are configured to manipulate and/or cause a controlled quantum state evolution of one or more atomic objects within the confinement apparatus. In various embodiments, the atomic objects within the atomic confinement apparatus (e.g., ions trapped within an ion trap) act as the data qubits and/or ancilla qubits of the quantum processor 115 of the quantum computer 110. For example, in an example embodiment, wherein the one or more manipulation sources 60 comprise one or more lasers, the lasers may provide one or more laser beams to atomic objects trapped within the confinement apparatus 120 within the cryostat and/or vacuum chamber 40. For example, the manipulation sources 60 may generate and/or provide laser beams configured to ionize atomic objects, initialize atomic objects within the defined two state qubit space of the quantum processor, perform gates one or more qubits of the quantum processor, read a quantum state of one or more qubits of the quantum processor, and/or the like.

In various embodiments, the quantum computer 110 comprises an optics collection system 70 configured to collect and/or detect photons generated by qubits (e.g., during reading procedures). The optics collection system 70 may comprise one or more optical elements (e.g., lenses, mirrors, waveguides, fiber optics cables, and/or the like) and one or more photodetectors. In various embodiments, the photodetectors may be photodiodes, photomultipliers, charge-coupled device (CCD) sensors, complementary metal oxide semiconductor (CMOS) sensors, Micro-Electro-Mechanical Systems (MEMS) sensors, and/or other photodetectors that are sensitive to light at an expected fluorescence wavelength of the qubits of the quantum computer 110. In various embodiments, the detectors may be in electronic communication with the quantum system controller 30 via one or more A/D converters 225 (see FIG. 2) and/or the like.

In various embodiments, the quantum computer 110 comprises one or more voltage sources 50. For example, the voltage sources 50 may comprise a plurality of voltage drivers and/or voltage sources and/or at least one RF driver and/or voltage source. The voltage sources 50 may be electrically coupled to the corresponding potential generating elements (e.g., electrodes) of the confinement apparatus 120, in an example embodiment. Varying the electrical potential(s) may move the ions between locations or states. In various embodiments, how to vary the electrical potential(s) may be defined by waveforms that specify one or more voltages to apply over a period of time. In various embodiments, the one or more voltage source 50 may be coupled to electrodes via circuitry including one or more high-voltage semiconductor switches. The circuitry coupling the voltage sources 50 to the electrodes may also include circuitry providing bias voltages, such as to a gate of one or more FETs in one or more of the high-voltage semiconductor switches. The circuitry coupling the voltage sources 50 the electrodes may also include circuitry connecting one or more voltage sources to the gates and/or drains of the one or more FETs in one or more of the high-voltage semiconductor switches. In various embodiments, the circuitry coupling the voltage sources 50 the electrodes may be located outside the cryostat and/or vacuum chamber 40, inside the cryostat and/or vacuum chamber 40, or both inside and outside the cryostat and/or vacuum chamber 40. In embodiments where the circuitry coupling the voltage sources 50 to the electrodes is located in the cryostat and/or vacuum chamber 40, the high-voltage semiconductor switch may be located in the cryostat and/or vacuum chamber 40. In various embodiments the circuitry coupling the voltage sources 50 to the electrodes, including the one or more high-voltage semiconductor switches, will be comprised of circuit components capable of and/or configured to operate at the temperatures for their location, such as those in the cryostat and/or vacuum chamber, which may have temperatures below 4 Kelvin.

In various embodiments, a computing entity 10 is configured to allow a user to provide input to the quantum computer 110 (e.g., via a user interface of the computing entity 10) and receive, view, and/or the like output from the quantum computer 110. The computing entity 10 may be in communication with the quantum system controller 30 of the quantum computer 110 via one or more wired or wireless networks 20 and/or via direct wired and/or wireless communications. In an example embodiment, the computing entity 10 may translate, configure, format, and/or the like information/data, quantum computing algorithms and/or circuits, and/or the like into a computing language, executable instructions, command sets, and/or the like that the quantum system controller 30 can understand and/or implement. For example, the controller 30 is configured to generate machine code level commands configured to, when executed by the appropriate components of the quantum computer 110, cause the performance of a quantum circuit by the quantum computer 110. In various embodiments, the performance of a quantum circuit may include providing and/or controlling voltages to one or more terminals of a high-voltage semiconductor switch, which may control how the high-voltage semiconductor switch provides voltage to one or more electrodes.

In various embodiments, the quantum system controller 30 is configured to control the voltage sources 50, cryostat system and/or vacuum system controlling the temperature and pressure within the cryostat and/or vacuum chamber 40, manipulation sources 60, and/or other systems controlling various environmental conditions (e.g., temperature, pressure, and/or the like) within the cryostat and/or vacuum chamber 40 and/or configured to manipulate and/or cause a controlled evolution of quantum states of one or more atomic objects within the confinement apparatus. For example, the quantum system controller 30 may cause a controlled evolution of quantum states of one or more atomic objects within the confinement apparatus to execute a quantum circuit and/or algorithm. For example, the quantum system controller 30 may cause a reading procedure comprising coherent shelving to be performed, possibly as part of executing a quantum circuit and/or algorithm. Additionally, the quantum system controller 30 is configured to communicate and/or receive input data from the optics collection system 70 and corresponding to the reading of the quantum state of qubits of the quantum computer 110. In various embodiments, the atomic objects confined within the confinement apparatus are used as qubits of the quantum computer 110.

In various embodiments, a quantum computer 110 comprises a quantum system controller 30 and a quantum processor 115. The quantum system controller 30 is configured to control various components of a quantum processor 115.

In various embodiments, the quantum system controller 30 is in communication with an optics collection system 70 such that the quantum system controller 30 is configured to receive input data captured and/or generated by the optics collection system 70. In various embodiments, the quantum system controller 30 is further configured to control a cryostat system and/or vacuum system controlling the temperature and pressure within the cryostat and/or vacuum chamber 40, cooling system, and/or other systems controlling the environmental conditions (e.g., temperature, humidity, pressure, and/or the like) within the cryostat and/or vacuum chamber 40.

As shown in FIG. 2, in various embodiments, the quantum system controller 30 may comprise various quantum system controller elements including processing element(s) 205, memory 210, driver controller elements 215, a communication interface 220, analog-digital (A/D) converter elements 225, and/or the like. In various embodiments, the quantum system controller 30 is configured to receive input data generated by the optics collection system via the A/D converter(s) 225. In various embodiments, the processing element(s) 205 are configured to operate as described herein.

In various embodiments, the processing element(s) 205 comprise processing elements such as programmable logic devices (CPLDs), microprocessors, coprocessing entities, application-specific instruction-set processors (ASIPs), integrated circuits, application specific integrated circuits (ASICs), field programmable gate arrays (FPGAs), programmable logic arrays (PLAs), hardware accelerators, other processing elements and/or circuitry, and/or the like. The term circuitry may refer to an entirely hardware embodiment or a combination of hardware and computer program products. In an example embodiment, a processing element 205 of the quantum system controller 30 comprises a clock and/or is in communication with a clock.

In various embodiments, the memory 210 comprises non-transitory memory such as volatile and/or non-volatile memory storage such as one or more of hard disks, ROM, PROM, EPROM, EEPROM, flash memory, MMCs, SD memory cards, Memory Sticks, CBRAM, PRAM, FeRAM, RRAM, SONOS, racetrack memory, RAM, DRAM, SRAM, FPM DRAM, EDO DRAM, SDRAM, DDR SDRAM, DDR2 SDRAM, DDR3 SDRAM, RDRAM, RIMM, DIMM, SIMM, VRAM, cache memory, register memory, and/or the like. In various embodiments, the memory 210 may store a queue of commands to be executed to cause a quantum algorithm and/or circuit to be executed (e.g., an executable queue), qubit records corresponding the qubits of quantum computer (e.g., in a qubit record data store, qubit record database, qubit record table, and/or the like), a calibration table, computer program code (e.g., in a one or more computer languages, specialized quantum system controller language(s), and/or the like), and/or the like. In an example embodiment, execution of at least a portion of the computer program code stored in the memory 210 (e.g., by a processing element 205) causes the quantum system controller 30 to perform one or more steps, operations, processes, procedures, and/or the like for generating one or more sets of commands configured to cause the quantum processor 115 to perform at least a portion of a quantum circuit; to update one or more qubit registries; and/or the like. In an example embodiment, execution of at least a portion of the computer program code stored in the memory 210 causes the quantum system controller 30 to cause one or more commands to be performed.

In various embodiments, the driver quantum system controller elements 215 include one or more drivers and/or quantum system controller elements each configured to control one or more drivers. In various embodiments, the driver quantum system controller elements 215 may comprise drivers and/or driver controllers. For example, the driver controllers may be configured to cause one or more corresponding drivers to be operated in accordance with executable instructions, commands, and/or the like generated, scheduled. and executed by the quantum system controller 30. For example, the processing element 205 may generate one or more commands to be performed by a first driver.

In various embodiments, the driver controller elements 215 enable the quantum system controller 30 to operate a voltage sources 50, manipulation sources 60, cooling system, vacuum systems, and/or the like. In various embodiments, the drivers may be drivers for controlling the flow of current and/or voltage applied to electrodes (e.g., configured to operate and/or control one or more voltage sources 50) used for maintaining and/or controlling the trapping potential of the confinement apparatus 120 (and/or other drivers for providing driver action sequences to potential generating elements of the confinement apparatus); laser drivers (e.g., configured to operate and/or control one or more manipulation sources 60); vacuum component drivers; cryostat and/or vacuum system component drivers; cooling system drivers, and/or the like.

In various embodiments where the drivers control the flow of current and/or voltage applied to electrodes, the drivers controller elements 215 may control the high-voltage semiconductor switch. For example, control of the high-voltage semiconductor switch may be by controlling the voltage applied to one or more of the FETs, including controlling the differences in voltage(s) applied to the gate, source, and/or drain of a FET. In various embodiments, the control of voltage(s) may be through additional circuits connected to the high-voltage semiconductor switch (not depicted in the figures) such as a switching network, an example of which is described in U.S. application Ser. No. 17/305,201, filed Jul. 1, 2021, the content of which is hereby incorporated by reference in its entirety.

In various embodiments, each of driver controller elements 215 correspond to an endpoint within the system (e.g., a component of a manipulation source 60, a component of a voltage source 50 (radio frequency voltage sources, arbitrary waveform generators (AWG), direct digital synthesizer (DDS), and/or other waveform generator), a component of a cooling and/or vacuum system, a component of the optics collection system 70, and/or the like). Each endpoint within the quantum computer 110 represents an individual hardware control. Each endpoint may have its own set of accepted micro-commands, in various embodiments. Examples include but are not limited to a voltage source 50 such as a direct digital synthesizer (DDS), component of an optics collection system 70 such as a photomultiplier tube (PMT), a component of a manipulation source 60 such as a laser driver and/or optical modulator switch, and/or general-purpose output (GPO). Individual commands for a DDS allow for setting power level, frequency and phase of a controlling signal generated thereby. Commands for a PMT interface include start/stop photon count and reset of count, in various embodiments. Commands for a GPO endpoint include setting and/or clearing one or more output lines. These output lines can be used to control external hardware in a manner synchronized with the execution of a quantum circuit.

In various embodiments, the quantum system controller 30 comprises means for communicating and/or receiving signals from one or more optical receiver components (e.g., of the optics collection system 70). For example, the quantum system controller 30 may comprise one or more analog-digital (A/D) converter elements 225 configured to receive signals from one or more optical receiver components (e.g., a photodetector of the optics collection system 70), calibration sensors, and/or the like. In various embodiments, the A/D converter elements 225 are configured to write the input data generated by converting the received signals generated by one or more optical receiver components of the optics collection system 70 to memory 210.

In various embodiments, the quantum system controller 30 may comprise a communication interface 220 for interfacing and/or communicating with, for example, a computing entity 10. For example, the quantum system controller 30 may comprise a communication interface 220 for receiving executable instructions, command sets, and/or the like from the computing entity 10 and providing output received from the quantum computer 110 (e.g., from an optics collection system 70) and/or the result of a processing the output to the computing entity 10. In various embodiments, the computing entity 10 and the quantum system controller 30 may communicate via a direct wired and/or wireless connection and/or via one or more wired and/or wireless networks 20.

FIG. 3 provides an illustrative schematic representative of an example computing entity 10 that can be used in conjunction with embodiments of the present disclosure. In various embodiments, a computing entity 10 is a classical (e.g., semiconductor-based) computer configured to allow a user to provide input to the quantum computer 110 (e.g., via a user interface of the computing entity 10) and receive, display, analyze, and/or the like output from the quantum computer 110. In various embodiments, a user may use computing entity 10 to provide input to the quantum computer 110 that may directly or indirectly control one or more high-voltage semiconductor switches, such as when a user may provide input that results in a quantum circuit being created and/or executed, which may require a high-voltage semiconductor switch to be enabled or disable (e.g., turned ON or OFF). For example, in various embodiments, a high-voltage semiconductor switch controls the application of voltage (e.g., by a voltage source 50) to an electrode of ion trap used as part of a quantum processor 115. As should be understood, various embodiments of high-voltage semiconductor switches may be used in a variety of other applications.

As shown in FIG. 3, a computing entity 10 can include an antenna 312, a transmitter 304 (e.g., radio), a receiver 306 (e.g., radio), and a processing element 308 that provides signals to and receives signals from the transmitter 304 and receiver 306, respectively. The signals provided to and received from the transmitter 304 and the receiver 306, respectively, may include signaling information/data in accordance with an air interface standard of applicable wireless systems to communicate with various entities, such as a quantum system controller 30, other computing entities 10, and/or the like. The computing entity 10 can include a network interface 320, which may provide signals to and receive signals in accordance with an interface standard of applicable network systems to communicate with various entities, such as a quantum system controller 30, other computing entities 10, and/or the like.

In this regard, the computing entity 10 may be capable of operating with one or more air interface standards, communication protocols, modulation types, and access types. For example, the computing entity 10 may be configured to receive and/or provide communications using a wired data transmission protocol, such as fiber distributed data interface (FDDI), digital subscriber line (DSL), Ethernet, asynchronous transfer mode (ATM), frame relay, data over cable service interface specification (DOCSIS), or any other wired transmission protocol. Similarly, the computing entity 10 may be configured to communicate via wireless external communication networks using any of a variety of protocols, such as general packet radio service (GPRS), Universal Mobile Telecommunications System (UMTS), Code Division Multiple Access 2000 (CDMA2000), CDMA2000 1× (1×RTT), Wideband Code Division Multiple Access (WCDMA), Global System for Mobile Communications (GSM), Enhanced Data rates for GSM Evolution (EDGE), Time Division-Synchronous Code Division Multiple Access (TD-SCDMA), Long Term Evolution (LTE), Evolved Universal Terrestrial Radio Access Network (E-UTRAN), Evolution-Data Optimized (EVDO), High Speed Packet Access (HSPA), High-Speed Downlink Packet Access (HSDPA), IEEE 802.11 (Wi-Fi), Wi-Fi Direct, 802.16 (WiMAX), ultra wideband (UWB), infrared (IR) protocols, near field communication (NFC) protocols, Wibree, Bluetooth protocols, wireless universal serial bus (USB) protocols, and/or any other wireless protocol. The computing entity 10 may use such protocols and standards to communicate using Border Gateway Protocol (BGP), Dynamic Host Configuration Protocol (DHCP), Domain Name System (DNS), File Transfer Protocol (FTP), Hypertext Transfer Protocol (HTTP), HTTP over TLS/SSL/Secure, Internet Message Access Protocol (IMAP), Network Time Protocol (NTP), Simple Mail Transfer Protocol (SMTP), Telnet, Transport Layer Security (TLS), Secure Sockets Layer (SSL), Internet Protocol (IP), Transmission Control Protocol (TCP), User Datagram Protocol (UDP), Datagram Congestion Control Protocol (DCCP), Stream Control Transmission Protocol (SCTP), HyperText Markup Language (HTML), and/or the like.

Via these communication standards and protocols, the computing entity 10 can communicate with various other entities using concepts such as Unstructured Supplementary Service information/data (USSD), Short Message Service (SMS), Multimedia Messaging Service (MMS), Dual-Tone Multi-Frequency Signaling (DTMF), and/or Subscriber Identity Module Dialer (SIM dialer). The computing entity 10 can also download changes, add-ons, and updates, for instance, to its firmware, software (e.g., including executable instructions, applications, program modules), and operating system.

The computing entity 10 may also comprise a user interface device comprising one or more user input/output interfaces (e.g., a display 316 and/or speaker/speaker driver coupled to a processing element 308 and a touch screen, keyboard, mouse, and/or microphone coupled to a processing element 308). For instance, the user output interface may be configured to provide an application, browser, user interface, interface, dashboard, screen, webpage, page, and/or similar words used herein interchangeably executing on and/or accessible via the computing entity 10 to cause display or audible presentation of information/data and for interaction therewith via one or more user input interfaces. The user input interface can comprise any of a number of devices allowing the computing entity 10 to receive data, such as a keypad 318 (hard or soft), a touch display, voice/speech or motion interfaces, scanners, readers, or other input device. In embodiments including a keypad 318, the keypad 318 can include (or cause display of) the conventional numeric (0-9) and related keys (#, *), and other keys used for operating the computing entity 10 and may include a full set of alphabetic keys or set of keys that may be activated to provide a full set of alphanumeric keys. In addition to providing input, the user input interface can be used, for example, to activate or deactivate certain functions, such as screen savers and/or sleep modes. Through such inputs the computing entity 10 can collect information/data, user interaction/input, and/or the like.

The computing entity 10 can also include volatile storage or memory 322 and/or non-volatile storage or memory 324, which can be embedded and/or may be removable. For instance, the non-volatile memory may be ROM, PROM, EPROM, EEPROM, flash memory, MMCs, SD memory cards, Memory Sticks, CBRAM, PRAM, FeRAM, RRAM, SONOS, racetrack memory, and/or the like. The volatile memory may be RAM, DRAM, SRAM, FPM DRAM, EDO DRAM, SDRAM, DDR SDRAM, DDR2 SDRAM, DDR3 SDRAM, RDRAM, RIMM, DIMM, SIMM, VRAM, cache memory, register memory, and/or the like. The volatile and non-volatile storage or memory can store databases, database instances, database management system entities, data, applications, programs, program modules, scripts, source code, object code, byte code, compiled code, interpreted code, machine code, executable instructions, and/or the like to implement the functions of the computing entity 10.

FIG. 4 provides a block diagram of a switch circuit that may be used in accordance with an example embodiment. In various embodiments, a high-voltage semiconductor switch 400 may be comprised of one or more switch subcircuits. For example, the embodiment of FIG. 4 comprises a first switch subcircuit 410A and a second switch subcircuit 410B. In various embodiments, a switch subcircuit 410 may be comprised of one or more FET circuits 420. In the embodiment depicted in FIG. 4, first switch subcircuit 410A is comprised of first FET circuit 420A and second switch subcircuit 410B is comprised of second FET circuit 420B. Various embodiments of the electrical components of each of high-voltage semiconductor switch 400, switch subcircuit 410, and FET circuit 420 are discussed further herein, though additional electrical components (not depicted) may be in each of the high-voltage semiconductor switch 400, switch subcircuit 410, and FET circuit 420, including resistors, capacitors, inductors, diodes, transistors, and/or the like.

In various embodiments, the high-voltage semiconductor switch 400 will contain additional electrical components and/or circuits (not depicted), including input and output terminals that will connect high-voltage semiconductor switch 400 to voltage sources 50 as well all the electrodes of the ion trap. In various embodiments, one high-voltage semiconductor switch 400 may connect to (e.g., be in electrical communication with) all of the electrodes. Alternatively, in other various embodiments, one high-voltage semiconductor switch 400 may connect to a single electrode or may connect to (e.g., be in electrical communication with) some, but not all, of the electrodes. As discussed further herein, control of the high-voltage semiconductor switch 400 may be achieved by controlling the voltages applied to the input terminals of high-voltage semiconductor switch 400 (not depicted), including the voltages applied to each switch subcircuit 410 and/or also each FET circuit 420, some which may act as enable or disable signals.

FIGS. 5A & 5B each provides a schematic diagram of different embodiments of FET circuit 420 that may be used in accordance with various example embodiments of high-voltage semiconductor switch 400. FIG. 5A provides a schematic diagram of FET circuit 520A comprised of two p-channel FETS (e.g., 525A, 525B); and FIG. 5B provides a schematic diagram of FET circuit 520B comprised of two p-channel FETs (e.g., 525A, 525B) and two capacitors (e.g., 529A, 529B). In various examples, capacitors may be used to match the load reactance.

In the embodiments depicted in each of FIGS. 5A and 5B, the gate of first FET 525A is connected to the gate of second FET 525B as well as being taken to a terminal, depicted as $V_{GATE}$ 530, where a voltage to the gates may be applied. As also depicted in the embodiments in each of FIGS. 5A and 5B, the source of first FET 525A is connected to the source of second FET 525B. The drains of each FET are taken to respective terminals. For example, the drain of first FET 525A is connected to a terminal, depicted as $V_{IN}$ 580, where an input voltage to the FET circuit 520A may be applied, and the drain of second FET 525B is connected to a terminal, depicted as $V_{OUT}$ 590, where an output of the FET circuit 520A may be connected. In the embodiments depicted in FIGS. 5A and 5B depict each FET as a p-channel FET, one or more of the FETs may be n-channel FETs (not depicted in FIG. 5A or 5B).

In the embodiment depicted in FIG. 5B, the FET circuit 520B is comprised of the additional circuitry of one or more capacitors 529. For example, in FIG. 5B, first capacitor 529A is connected to the gate of first FET 525A and the input terminal $V_{IN}$ 580 and second capacitor 529B is connected to the gate of second FET 525B and the output terminal $V_{OUT}$ 590; and the gates and capacitors are all connected together as depicted in FIG. 5B. In various embodiments, such capacitors may be used to tailor the high-voltage semiconductor switch to different loads and/or used to balance the capacitance of high-voltage semiconductor switch 400. For example, such capacitors may be configured to match the load capacitance with the capacitance of the high-voltage semiconductor switch so as to reduce switch glitch and/or other switch-related noise. In various embodiments, the size of such capacitors may be chosen to optimize a circuit. For example, larger capacitor values may reduce the output switch glitch amplitude but may also slow down the switch turn-on and turn-off times. Determination of the capacitor values may vary depending on load and/or application, such as in systems that may be configured differently, such as in one example that may be configured for speed while accepting lower accuracy. In additional embodiments, the capacitors may be configured, coordinated with, and/or sized based on output load capacitors (not depicted), which may be tied to AC ground. In various embodiments (e.g., the embodiment depicted in FIG. 4), the high-voltage semiconductor switch 400 may have more than one FET circuit 420, and the capacitors in a first FET circuit 420A may be different from the capacitors in a second FET circuit 420B. Such difference may be to balance the total internal capacitance, such as with compensation from such capacitors. In various embodiments, such balancing of the total internal capacitance may mitigate or eliminate charge injection, which may have been due to a capacitive imbalance. In various embodiments using more than one high-voltage semiconductor switch, such capacitors may be different between each high-voltage semiconductor switch in order to tailor each switch to a load, such as the load of an electrode in a quantum system 100. While each of the first capacitor 529A and the second capacitor 529B is depicted as an individual electrical component, each may be representative of one or more electrical components placed in series, in parallel, or in series-parallel. Thus the embodiment of FIG. 5B is an example of how additional electrical components may be included and connected in FET circuit 520.

FIG. 6 depicts a schematic diagram of a portion of a switch subcircuit that may be used in accordance with an example embodiment. The switch subcircuit 610 of the embodiment depicted in FIG. 6 is an embodiment of switch subcircuit 410. In switch subcircuit 610, there is a single FET circuit 620 comprised of p-channel first FET 625A and p-channel second FET 625B connected in a manner as described above with the gates of each FET connected, with the sources of each FET connected, and with the drains of each FET being connected to either an input terminal (e.g., $V_{IN}$ 680) or an output terminal (e.g., $V_{OUT}$ 690). While the embodiment of FIG. 6 depicts a single FET circuit 620, other embodiments may include more than one FET circuit in a switch subcircuit, including but not limited to the embodiment depicted in FIG. 7. Additionally, switch subcircuit 610 may contain additional electrical components not depicted, including but not limited to transistors, capacitors, and resistors.

FIG. 7 provides a schematic diagram of a portion of a switch subcircuit that may be used in accordance with an example embodiment. In contrast to FIG. 6, the embodiment depicted in FIG. 7 depicts more than one FET circuit (i.e., first FET circuit 720A1 and second FET circuit 720A2) in a portion of switch subcircuit circuit 710, specifically depicting two FET circuits (e.g., 720A1, 720A2). Other various embodiments may have more than two FET circuits in parallel. Switch subcircuit 710 may contain additional electrical components not depicted, including but not limited to transistors, capacitors, and resistors. In the embodiment depicted in FIG. 7, first FET circuit 720A1 and second FET circuit 720A2 are connected in parallel. Thus, as depicted, the gates of each first FET 725A1 and second FET 725B1 of first FET circuit 720A1 and the gates of first FET 725A2 and second FET 725B2 of second FET circuit 720A2 are connected together and also connected to a gate voltage input terminal, depicted as $V_{GATE}$ 730. The input terminals of each FET circuit, depicted as the drain of first FET 725A1 and the drain of second FET 725A2 of first FET circuit 720A1, are connected together at input terminal $V_{IN}$ 780. The output terminals of each FET circuit, depicted as the drain of first FET 725B1 and the drain of second FET 725B2 of second FET circuit 720A2, are connected together at output terminal $V_{OUT}$ 790. The embodiment depicted in FIG. 7 is switch subcircuit 710 with two FET circuits (e.g., 720A1, 720A2) connected in parallel. In various embodiments, one or more switch subcircuits (e.g., 410A, 410B) may have two or more FET circuits connected in parallel.

In various embodiments of high-voltage semiconductor switch 400, the number of FET circuits 420 in a switch subcircuit 410 may be the same as or may be different than the number of FET circuits 420 in a switch subcircuit 410. In an example embodiment of high-voltage semiconductor switch 400 (not depicted), first switch subcircuit 410A may be comprised of one first FET circuit 420A and second switch subcircuit 410B may be comprised of 2 FET circuits 420 (e.g. a second switch subcircuit 420B and a third switch subcircuit (now shown)). In such an embodiment, the ratio of FET circuits 420 in the second switch subcircuit 410B to FET circuits 420 in the first switch subcircuit 410A is a number greater than 1. For example, in various embodiment, a ratio of the number of FET circuits 420 in the second switch subcircuit 410B to the number of FET circuits 420 in the first switch subcircuit 410A may be 10 to 1 or may be 167 to 80. In other various embodiments, the ratio of FET circuits 420 in the second switch subcircuit 410B to FET circuits 420 in the first switch subcircuit 410A may be less than 1. In various embodiments, the FETs in FET circuit 420A may all be p-channel FETs and the FETs in FET circuit 420B may all be n-channel FETs. In various embodiments using all p-channel FETs, the various FET circuits may be connected to different voltage shifting transistors such that each of the FET circuits may conduct with different enable logic implemented with the high-voltage semiconductor switch 400. In various embodiments, the size of each FET in each of the switch subcircuits 410 may be the same size or may be a different size. The size of the FET may be the impedance of the FET and/or may be the voltage and/or current characteristics of the FET. Differently sized FETs may have different physical characteristics, such as different channel sizes.

In various embodiments, the ratio of the number of FET circuits 420B to the number of FET circuits 420A may also be referred to as a multiplier, and the ratio used may be determined based on a load. Some of these embodiments may be for high-voltage semiconductor switches with one FET size being used for each of the FETs in the high-voltage semiconductor switch. For example, a high-voltage semiconductor switch may have a higher ratio for a load with a higher capacitance. In various embodiments, the ratio to use may be determined via simulation or may be empirically derived. In various embodiments using a simulation to determine the ratio, the simulation may analyze the load, the electrical circuitry between the high-voltage semiconductor switch and the load, the signals to be provided to the load, and the specific models each electrical component of the high-voltage semiconductor switch. Through one or more of such simulations, a ratio may be determined. In various embodiments, determination of the ratio may be based on a desired response. In various embodiments, such as those that may not use only one size of FETs, the ratio previously described may need to additionally be adjusted for the size of FETs used. Larger sizes of FETs may allow for the driving of larger load. Larger, or different, sizes of FETs within the high-voltage semiconductor switch may allow for the ratio being set in view of the FET size and a load, which may be in order to configure the circuit for impedance matching. Differently sized FETs may also be associated with additional electrical components to address impedance matching.

In various embodiments, the higher (or lower) the number of FET circuits 420 in a high-voltage semiconductor switch 400 may improve (or worsen) the attenuation of a signal passed through the high-voltage semiconductor switch 400 but it may also increase (or decrease) signal delay of the signal passed through the high-voltage semiconductor switch 400. In various embodiments, a higher number of FET circuits 420 increases the number of FETs 425, and this may increase signal delay be due to a larger capacitance requiring larger charge and discharge times, which the capacitance being larger due to the higher number of FETs, particularly the capacitance between the gate and source of each FET. Thus the time for a signal to pass from the input terminal of the high-voltage semiconductor switch 400 to the time for the signal to reach the output terminal may be raised (or lowered) by increasing (or decreasing) the number of FET circuits 425. Moreover, the attenuation and signal delay may change with the frequency of the signal being passed through the high-voltage semiconductor switch. In embodiments desiring a specific attenuation and/or delay time at a specific frequency, a total number of FET circuits 425 may be chosen to achieve a specific ratio at a desired attenuation and/or delay time. In various embodiments, determining a total number of FET circuits 425 may be simulated to address signal delay and attenuation at various frequencies.

FIG. 8 provides a schematic diagram of a switch circuit that may be used in accordance with an example embodiment. In various embodiments, the high-voltage semiconductor switch 800 may be comprised of two switch subcircuits (e.g., 810A, 810B). Each of the switch subcircuits 810A, 810B may be comprised of one or more FET circuits (e.g., first FET circuit 820A for first switch subcircuit 810A, second FET circuit 820B for second switch subcircuit 810B). In FIG. 8, first switch subcircuit 810A is comprised of first FET circuit 820A and second switch subcircuit 810B is comprise of second FET circuit 820B. As depicted in FIG. 8, first FET circuit 820A is comprised of two p-channel FETs (i.e., first FET 825A and second FET 825B) with their gates connected and with their sources connected as well as a p-channel FET 828A with its gate connected to the sources of the two p-channel FETs (first FET 825A and second FET 825B), and second FET circuit 820B is comprised of two n-channel FETs (third FET 825C and fourth FET 825D) with their gates connected and with their sources connected as well as a n-channel FET 828B with its gate connected to the sources of the two n-channel FETs (third FET 825C and fourth FET 825D). In various embodiments of high-voltage semiconductor switch 800, FETs 828A and 828B may be referred to as voltage-shifting transistors (e.g., first voltage-shifting FET 828A and second voltage-shifting FET 828B). The connected gates of the first and FETs 825A, 825B of first FET circuit 820A are connected to a gate terminal, $V_{GATE}$ 830A; and the connected gates of the third and fourth FETs 825C, 825D of second FET circuit 820B are connected to a gate terminal, $V_{GATE}$ 830B. In various embodiments, the gate terminals $V_{GATE}$ 830A and $V_{GATE}$ 830B may be connected or, alternatively, these may not be connected. The drain of first FET 825A of first FET circuit 820A is connected to input terminal $V_{IN}$ 880A; and the drain of fourth FET 825D of second FET circuit 820B is connected to input terminal $V_{IN}$ 880B. In various embodiments, first voltage-shifting FET 828A is connected to additional electrical components in high-voltage semiconductor switch 800 at its drain terminal 860A and its source terminal 860B. In various embodiments, second voltage-shifting FET 828B is connected to additional electrical components in high-voltage semiconductor switch 800 at its drain terminal 860C and its source terminal 860D. In various embodiments, the input terminals $V_{IN}$ 880A and $V_{IN}$ 880B may be connected or, alternatively, these may not be connected. The drain of second FET 825B of first FET circuit 820A is connected to output terminal $V_{OUT}$ 890; and the drain of third FET 825C of second FET circuit 820B is also connected to output terminal $V_{OUT}$ 890. In alternative embodiments, the output of each of first and second FET circuits 820A, FET 820B may not be connected and may be kept separate. In various embodiments, first switch subcircuit 810A may be referred to as a first leg and second switch subcircuit 810B may be referred to as a second leg. In embodiments with two legs, signal bipolarity from $V_{IN}$ 880A and $V_{IN}$ 880B when they are connected together may be transmitted symmetrically while minimizing on-resistance during signal transmission. The off-state leakage is governed by the off-resistance of the FET configuration and is minimized by the transistor cascade in each of the connected legs of the high-voltage semiconductor switch 800.

In various embodiments, the connections of the drains and sources of the first and second voltage-shifting FETs 828A, 828B may be connected to allow the high-voltage semiconductor switch 800 to act as a voltage-shifting transistor that may prohibit the voltage between the gate and source of FETs in the FET circuits (e.g., 820A, 820B) from exceeding a voltage limitation of the gate-source junction in these FETs (e.g., 825A, 825B, 825C, 825D). Thus various embodiments have internal feedback for high-voltage compensation such that the high-voltage semiconductor switch may act as a transmission gate driven by a voltage translator to allow for an enable/disable achieved via a logic-level signal.

FIG. 9 provides a schematic diagram of a high-voltage semiconductor switch 900 that may be used in accordance with an example embodiment. High-voltage semiconductor switch 900 includes two switch subcircuits (e.g., 910A, 910B).

First switch subcircuit 910A includes a first FET circuit 920A and a first voltage-shifting FET 928A. First FET circuit 920A includes a first FET 925A and a second FET 925B. The gates of first FET 925A and second FET 925B are connected, and the sources of first FET 925A and second FET 925B are connected. The gate of first voltage-shifting FET 928A is connected to the sources of first and second FETs 925A, 925B. The drain of first FET 925A is connected to a voltage input terminal 980A. The drain of second FET 925B is connected to a voltage output terminal 990. The drain and sources of first voltage-shifting FET 928A are each connected to additional electrical components in high-voltage semiconductor switch 900. While not depicted, first switch subcircuit 910A may include additional electrical components.

Second switch subcircuit 910B includes a first FET circuit 920B and a second voltage-shifting transistor FET 928B. Second FET circuit 920B includes third FET 925C and fourth FET 925D (which in various embodiments may be referred to as the first FET and second FET of second switch subcircuit 910B). The gates of third and fourth FETs 925C, 925D are connected, and the sources of third and fourth FETs 925C, 925D are connected. The gate of second voltage-shifting FET 928B is connected to the sources of third and fourth FETs 925C, 925D. The drain of fourth FET 925D is connected to a voltage input terminal 980A, which may be the same as or connected to input terminal 980A. The drain of third FET 925C is connected to a voltage output terminal 990, which is also connected to the drain of second FET 925B of first switch subcircuit 910A. The drain and sources of second voltage-shifting FET 928B are each connected to additional electrical components in high-voltage semiconductor switch 900. While not depicted, first switch subcircuit 910A may include additional electrical components.

In the embodiment of FIG. 9, the high-voltage semiconductor switch 900 includes additional electrical components in addition to those in the first and second switch subcircuits 910A, 910B. In various embodiments, the additional electrical components of high-voltage semiconductor switch 900 provide signals to the terminals of the first and second switch subcircuits 910A, 910B in order to cause each switch subcircuit to act as a transmission gate. While depicted in FIG. 9 are the additional electrical components of transistors 930A-930F, 935A-935F and resistors 940A-940F, various embodiments may contain additional electrical components not depicted.

In the embodiment of FIG. 9, high-voltage semiconductor switch 900 has 8 input terminals. Input terminals 980A, 980B are described above. In various embodiments, input terminals 970A and 970B are biased at +20 volts and −20 volts, respectively. In various embodiments, input terminals 972A and 972B are biased at +15 volts and −15 volts, respectively. In various embodiments, input terminals 975A and 975B are biased with enable signals such that input terminal 975A and input terminal 975B may have a voltage differential of 0V or may have a voltage differential of 5V. In various embodiments, a voltage differential of 0V between input terminals 975A and 975B may be used to turn the switch OFF (e.g., when the switch does not allow signals on $V_{IN}$ 980A, 980B to be transmitted to $V_{OUT}$ 990), and a voltage differential of 5V between input terminals 975A and 975B may be used to turn the switch ON (e.g., when the switch allows signals on $V_{IN}$ 980A, 980B to be transmitted to $V_{OUT}$ 990).

High-voltage semiconductor switch 900, as depicted, includes p-channel FETs 930A-F, n-channel FETs 935A-F, and resistors 940A-G.

The input terminal 970A is connected to the drain of n-channel FET 935E, the source of p-channel FET 930A, to a first terminal of resistor 940D, and to the source of p-channel FET 930C. The input terminal 970B is connected to the drain of p-channel FET 930E, the source of n-channel FET 935A, to the source of n-channel FET 935C, and to a second terminal of resistor 940E.

The input terminal 972A is connected to the gate of n-channel FET 935E, the gate of p-channel FET 930B, the gate of p-channel FET 930D, and to the drain of n-channel second voltage-shifting FET 928B. The input terminal 972B is connected to the gate of p-channel FET 930E, the gate of n-channel FET 935B, the gate of p-channel FET 935D, and to the drain of p-channel first voltage-shifting FET 928A.

The input terminal 975A is connected to the gate of n-channel FET 935F. The input terminal 975B is connected to the gate of p-channel FET 930F.

The drain of p-channel FET 930A is connected to the gate of p-channel FET 930A as well as the gate of p-channel FET 930C. The drain of p-channel FET 930A is also connected to a first terminal of resistor 940A.

The second terminal of resistor 940A is connected to the source of n-channel FET 935E as well as the drain of n-channel FET 935F. The source of n-channel FET 935F is connected to a first terminal of resistor 940C.

The drain of n-channel FET 935A is connected to the gate of n-channel FET 935A as well as the gate of n-channel FET 935C. The drain of n-channel FET 935A is also connected to a second terminal of resistor 940B.

The first terminal of resistor 940B is connected to the source of p-channel FET 930E as well as the drain of p-channel FET 930F. The source of p-channel FET 930F is connected to a second terminal of resistor 940C.

A second terminal of resistor 940D is connected the source of p-channel FET 930B, and the drain of p-channel FET 930B is connected to a first terminal of resistor 940F and to the source of p-channel first voltage-shifting FET 928A. A second terminal of resistor 940F is connected to the gates of p-channel first and second FETs 925A, 925B as well as the drain of n-channel FET 935D. The source of n-channel FET 935D is connected to the drain of n-channel FET 935C.

A first terminal of resistor 940E is connected the source of n-channel FET 935B, and the drain of n-channel FET 935B is connected to a second terminal of resistor 940G and to the source of n-channel second voltage-shifting FET 928B. A first terminal of resistor 940G is connected to the gates of n-channel third and fourth FETs 925C, 925D as well as the drain of p-channel FET 930D. The source of p-channel FET 930D is connected to the drain of p-channel FET 930C.

In various embodiments, input terminals 975A and 975B are provided with a +5V differential as an enable signal or ON signal. With the ON signal, the FETs of each of the first FET circuit 920A and the second FET circuit 920B are ON and the input signal from $V_{IN}$ 980A, 980B is transmitted to $V_{OUT}$ 990. In various embodiments, input terminals 975A and 975B are provided with a 0V differential as an OFF signal, and either of the FETs in each of the first FET circuit 920A and the second FET circuit 920B are OFF, and the input signal from $V_{IN}$ 980A, 980B is not transmitted to $V_{OUT}$ 990. In various embodiments, while the enable signal may be a 5V voltage differential, the signal passed from $V_{IN}$ to $V_{OUT}$ may be, for example, equal to or greater than +/−15V.

Additionally, in various embodiments when an ON signal is provided to input terminals 975A and 975B, the voltage of the connected sources of a FET circuit (e.g., 920A, 920B) may be between +/−15 V based on input signals to $V_{IN}$ 980A, 980B, the voltage difference between the connected sources of a FET circuit (e.g., 920A, 920B) and the source of the voltage shifting transistor may be +/−1V, and the difference between the connected gates of a FET circuit (e.g., 920A, 920B) may be +/−5V. In various embodiments when an OFF signal is provided to input terminals 975A and 975B, the difference between the connected gates of a FET circuit (e.g., 920A, 920B) may change to be +/−1V.

For example, in various embodiments, when an ON signal is provided, the voltage of the connected sources of a p-channel first and second FETs 925A, 925B may be between +/−15 V based on a signal to $V_{IN}$ 980A, the voltage difference between the connected sources of p-channel first and second FETs 925A, 925B and the source of the first voltage shifting transistor 928A may be 1V, and the difference between the connected gates of p-channel first and second FETs 925A, 925B may be may be −5V. In such embodiments, when an OFF signal is provided to input terminals 975A and 975B, the difference between the connected gates of p-channel first and second FETs 925A, 925B may change to 1V.

In various embodiments, a high-voltage semiconductor switch may be configured to continuously cycle at high voltage signals, such as by using DMOSFETs. In a first such embodiment the high voltage may be +/−17V, and in a second such embodiment the high voltage may be +/−20V. In other such embodiments the high voltage may be higher (e.g., +/−25V or +/−30V). In various embodiments where the high-voltage semiconductor switch is located in a cryostat and/or vacuum chamber 40, the p-type and n-type doping densities are sufficiently high to avoid carrier freeze-out that occurs at lower temperatures while also being low enough so as to not suffer carrier scattering. Freeze-out may refer to the amount of energy required by the dopants to ionize and produce carriers being thermal energy that, in a low temperature environment, may be too low to ionize such that the dopants will not be sufficiently ionized and, thus, not sufficiently operate. When a FET experiences freeze-out, such as at cryogenic temperatures, electrons may not have sufficient energy to jump between conduction bands, which may prevent the FET from conducting as expected.

FIG. 10 provides a schematic diagram of a high-voltage semiconductor switch 1000 that may be used in accordance with an example embodiment. The high-voltage semiconductor switch 1000 is an exemplary embodiment of the aforementioned high-voltage semiconductor switch 900 of FIG. 9, which, as described above, may include additional electrical components, such as additional capacitors in the first switch subcircuit 910A. This example embodiment of FIG. 10 utilizes the FET circuit 1010A, which is a FET circuit as depicted in FIG. 5B. Where reference numbers in FIG. 10 include the same reference numbers as in FIG. 9, the description above regarding FIG. 9 is also applicable and is not repeated.

As depicted in FIG. 10, first switch subcircuit 1010A includes a first FET circuit 1020A and a first voltage-shifting FET 928A. First FET circuit 1020A includes a first FET 1025A, a second FET 1025B, a first capacitor 1029A, and a second capacitor 1029B. The gates of first FET 1025A and second FET 1025B are connected, and the sources of first FET 1025A and second FET 1025B are connected. The gate of first voltage-shifting FET 928A is connected to the sources of first and second FETs 1025A, 1025B. The drain of first FET 1025A is connected to a voltage input terminal 980A and to a first side of a first capacitor 1029A. The second side of the first capacitor 1029A is connected to the gate of the first FET 1025A. The drain of second FET 1025B is connected to a voltage output terminal 990 and to a first side of a second capacitor 1029B. The second side of the second capacitor 1029B is connected to the gate of the second FET 1025B. The drain and sources of first voltage-shifting FET 928A are each connected to additional electrical components in high-voltage semiconductor switch 1000. While not depicted, first switch subcircuit 1010A may include additional electrical components.

The first capacitor 1029A and the second capacitor 1029B, as is described herein with regard to FIG. 5B, may be used to tailor the high-voltage semiconductor switch 1000 to different loads and/or used to balance the capacitance of high-voltage semiconductor switch 1000. Capacitors 1029A, 1029B may be configured to balance gate capacitance between the two sides of the high-voltage semiconductor switch 1000 to minimize charge injection and, thus, reduce switch glitch and/or other switch-related noise.

Many modifications and other embodiments of the invention set forth herein will come to mind to one skilled in the art to which the invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A high-voltage semiconductor switch comprising:
    a first switch subcircuit comprising one or more FET circuits and a first voltage-shifting FET, wherein a first FET circuit of the first switch subcircuit comprises a first FET and a second FET;
    a second switch sub circuit comprising one or more FET circuits and a second voltage-shifting transistor, wherein a first FET circuit of the second switch subcircuit comprises a third FET and a fourth FET;
    wherein each of the first FET, the second FET, the third FET, the fourth FET, the first voltage-shifting FET, and the second voltage-shifting transistor comprises a gate, a drain, and a source;
    wherein:
        the gate of the first FET and the gate of the second FET are connected to a gate terminal of the first switch subcircuit;
        the gate of the third FET and the gate of the fourth FET are connected to a gate terminal of the second switch subcircuit;
        the source of the first FET, the source of the second FET, and the gate of the first voltage-shifting FET are connected; and
        the source of the third FET, the source of the fourth FET, and the gate of the second voltage-shifting FET are connected; and
    the high-voltage semiconductor switch further comprising:
    an input terminal connected to the drain of the first FET and the drain of the fourth FET; and an output terminal connected to the drain of the second FET and the drain of the third FET.

2. The high-voltage semiconductor switch of claim 1, wherein the output terminal of the high-voltage semiconductor switch is in electrical communication with at least one electrode of an ion trap of a quantum computing system.

3. The high-voltage semiconductor switch of claim 2, wherein the high-voltage semiconductor switch is located in a cryostat of the quantum computing system.

4. The high-voltage semiconductor switch of claim 1, wherein the first FET and the second FET are p-channel FETs and the third FET and the fourth FET are n-channel FETs.

5. The high-voltage semiconductor switch of claim 1, wherein each FET in the first FET circuit of the first switch subcircuit and in the first FET circuit of the second switch subcircuit is a DMOS FET.

6. The high-voltage semiconductor switch of claim 1, wherein the first switch subcircuit further comprises a second FET circuit, wherein the first FET circuit of the first switch subcircuit and the second FET circuit of the first switch subcircuit are connected in parallel.

7. The high-voltage semiconductor switch of claim 1, wherein a ratio of a number of the one or more FET circuits of the first switch subcircuit to a number of the one or more FET circuits of the second switch subcircuit is greater than one.

8. The high-voltage semiconductor switch of claim 1, wherein the high-voltage semiconductor switch is configured to minimize freeze-out down to and below 20 Kelvin.

9. The high-voltage semiconductor switch of claim 1, wherein the high-voltage semiconductor switch is monolithically integrated into a semiconductor material.

10. The high-voltage semiconductor switch of claim 1, wherein at least one of the first switch subcircuit and the second switch subcircuit comprises at least one capacitor, wherein the at least one capacitor mitigates charge injection to a load.

11. A method of driving a high-voltage switching circuit, the method comprising:
providing a high-voltage semiconductor switch comprising:
a first switch subcircuit comprising one or more FET circuits and a first voltage-shifting FET, wherein a first FET circuit of the first switch subcircuit comprises a first FET and a second FET;
a second switch sub circuit comprising one or more FET circuits and a second voltage-shifting transistor, wherein a first FET circuit of the second switch subcircuit comprises a third FET and a fourth FET;
wherein each of the first FET, the second FET, the third FET, the fourth FET, the first voltage-shifting FET, and the second voltage-shifting transistor comprises a gate, a drain, and a source;
wherein:
the gate of the first FET and the gate of the second FET are connected to a gate terminal of the first switch subcircuit;
the gate of the third FET and the gate of the fourth FET are connected to a gate terminal of the second switch subcircuit;
the source of the first FET, the source of the second FET, and the gate of the first voltage-shifting FET are connected; and
the source of the third FET, the source of the fourth FET, and the gate of the second voltage-shifting FET are connected; and
the high-voltage semiconductor switch further comprising:
an input terminal connected to the drain of the first FET and the drain of the fourth FET; and
an output terminal connected to the drain of the second FET and the drain of the third FET,
applying a first voltage to the input terminal, wherein application of the first voltage to the input terminal causes
switching of the first switch subcircuit to conduct by applying the first voltage to a first and a second terminal of the high-voltage semiconductor switch, when the first voltage is an enable signal that causes the first FET, the second FET, the third FET, and the fourth FET to conduct; or
switching of the first switch subcircuit to not conduct by applying the first voltage to the first and the second terminal of the high-voltage semiconductor switch, when the first voltage is a disable signal that causes either the first FET, the second FET, or the first FET and second FET to not conduct and causes either the third FET, the fourth FET, or the third FET and the fourth FET to not conduct.

12. The method of claim 11, wherein the output terminal of the high-voltage semiconductor switch is in electrical communication with at least one electrode of an ion trap of a quantum computing system.

13. The method of claim 12, wherein the high-voltage semiconductor switch is located in a cryostat of the quantum computing system.

14. The method of claim 11, wherein the first FET and the second FET are p-channel FETs and the third FET and the fourth FET are n-channel FETs.

15. The method of claim 11, wherein each FET in the first FET circuit of the first switch subcircuit and in the first FET circuit of the second switch subcircuit is a DMOS FET.

16. The method of claim 11, wherein the first switch subcircuit further comprises a second FET circuit, wherein the first FET circuit of the first switch subcircuit and the second FET circuit of the first switch subcircuit are connected in parallel.

17. The method of claim 11, wherein a ratio of a number of the one or more FET circuits of the first switch subcircuit to a number of the one or more FET circuits of the second switch subcircuit is greater than one.

18. The method of claim 11, wherein the high-voltage semiconductor switch is configured to minimize freeze-out down to and below 20 Kelvin.

19. The method of claim 11, wherein the high-voltage semiconductor switch is monolithically integrated into a semiconductor material.

20. The method of claim 11, wherein at least one of the first switch subcircuit and the second switch subcircuit comprises at least one capacitor, wherein the at least one capacitor mitigates charge injection to a load.

* * * * *

UNITED STATES PATENT AND TRADEMARK OFFICE
CERTIFICATE OF CORRECTION

| | | |
|---|---|---|
| PATENT NO. | : 11,929,743 B2 | Page 1 of 1 |
| APPLICATION NO. | : 17/859672 | |
| DATED | : March 12, 2024 | |
| INVENTOR(S) | : David A. Deen et al. | |

It is certified that error appears in the above-identified patent and that said Letters Patent is hereby corrected as shown below:

In the Claims

In Column 22, Line 43, Claim 1, delete "sub circuit" and insert -- subcircuit --, therefor.

In Column 23, Line 48, Claim 11, delete "sub circuit" and insert -- subcircuit --, therefor.

Signed and Sealed this
Eighth Day of October, 2024

*Katherine Kelly Vidal*

Katherine Kelly Vidal
*Director of the United States Patent and Trademark Office*